United States Patent
Lee et al.

(10) Patent No.: US 11,676,963 B2
(45) Date of Patent: Jun. 13, 2023

(54) INTEGRATED CIRCUIT DEVICE AND METHOD OF MANUFACTURING THE SAME

(71) Applicant: Samsung Electronics Co., Ltd., Suwon-si (KR)

(72) Inventors: Seungryul Lee, Seoul (KR); Yongseung Kim, Seongnam-si (KR); Jungtaek Kim, Yongin-si (KR); Pankwi Park, Incheon (KR); Dongchan Suh, Yangju-si (KR); Moonseung Yang, Hwaseong-si (KR); Seojin Jeong, Incheon (KR); Minhee Choi, Suwon-si (KR); Ryong Ha, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/584,877

(22) Filed: Jan. 26, 2022

(65) Prior Publication Data
US 2022/0149040 A1  May 12, 2022

Related U.S. Application Data

(63) Continuation of application No. 16/841,806, filed on Apr. 7, 2020, now Pat. No. 11,264,381.

(30) Foreign Application Priority Data

Sep. 17, 2019 (KR) .................. 10-2019-0114366

(51) Int. Cl.
*H01L 27/088* (2006.01)
*H01L 29/423* (2006.01)
(Continued)

(52) U.S. Cl.
CPC .. *H01L 27/0886* (2013.01); *H01L 21/823431* (2013.01); *H01L 21/823468* (2013.01);
(Continued)

(58) Field of Classification Search
CPC ......... H01L 27/0886; H01L 21/823431; H01L 21/823468; H01L 29/0673; H01L 29/4238;
(Continued)

(56) References Cited

U.S. PATENT DOCUMENTS 9,620,590 B1  4/2017 Bergendahl et al.
9,627,384 B2  4/2017 Murthy et al.
(Continued)

*Primary Examiner* — Jonathan Han
(74) *Attorney, Agent, or Firm* — Harness, Dickey & Pierce, P.L.C.

(57) ABSTRACT

An integrated circuit device includes a fin-type active region protruding from a substrate and extending in a first direction, a plurality of semiconductor patterns disposed apart from an upper surface of the fin-type active region, the plurality of semiconductor patterns each including a channel region; a gate electrode surrounding the plurality of semiconductor patterns, extending in a second direction perpendicular to the first direction, and including a main gate electrode, which is disposed on an uppermost semiconductor pattern of the plurality of semiconductor patterns and extends in the second direction, and a sub-gate electrode disposed between the plurality of semiconductor patterns; a spacer structure disposed on both sidewalls of the main gate electrode; and a source/drain region connected to the plurality of semiconductor patterns, disposed at both sides of the gate electrode, and contacting a bottom surface of the spacer structure.

20 Claims, 24 Drawing Sheets

(51) Int. Cl.
*H01L 29/78* (2006.01)
*H01L 21/8234* (2006.01)
*H01L 29/06* (2006.01)

(52) U.S. Cl.
CPC ...... *H01L 29/0673* (2013.01); *H01L 29/4238* (2013.01); *H01L 29/785* (2013.01)

(58) Field of Classification Search
CPC . H01L 29/785; H01L 29/165; H01L 29/0653; H01L 29/0847; H01L 29/42392; H01L 29/66439; H01L 29/775; H01L 29/78696; H01L 29/7853; H01L 21/823821; H01L 27/0922; H01L 27/0924; H01L 29/0638; H01L 29/0684; H01L 29/7855; H01L 21/02532; H01L 21/823418; H01L 29/66795; H01L 29/7845; H01L 29/7848; B82Y 10/00
See application file for complete search history.

(56) References Cited

U.S. PATENT DOCUMENTS

| | | |
|---|---|---|
| 9,673,279 B2 * | 6/2017 | Lee .................. H01L 29/42392 |
| 9,748,352 B2 | 8/2017 | Liu et al. |
| 9,881,998 B1 | 1/2018 | Cheng et al. |
| 9,991,352 B1 * | 6/2018 | Frougier ........... H01L 29/42364 |
| 2014/0151639 A1 * | 6/2014 | Chang ................ H01L 29/0673 257/27 |
| 2017/0213905 A1 | 7/2017 | Lee et al. |
| 2017/0256609 A1 * | 9/2017 | Bhuwalka ......... H01L 29/78696 |
| 2018/0358436 A1 * | 12/2018 | Jambunathan ...... H01L 29/0673 |
| 2019/0067490 A1 | 2/2019 | Yang et al. |
| 2019/0096996 A1 | 3/2019 | Song et al. |

* cited by examiner

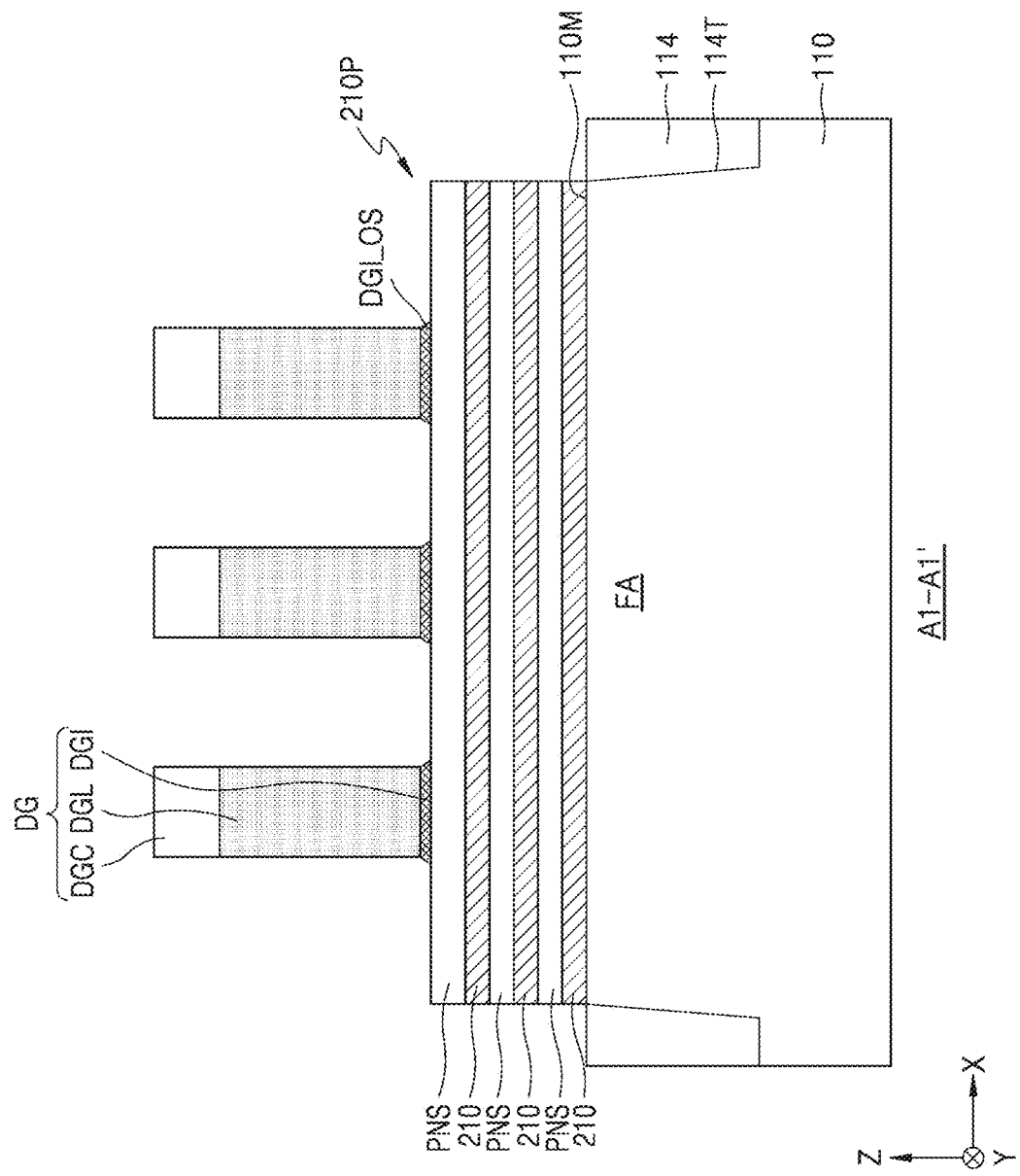

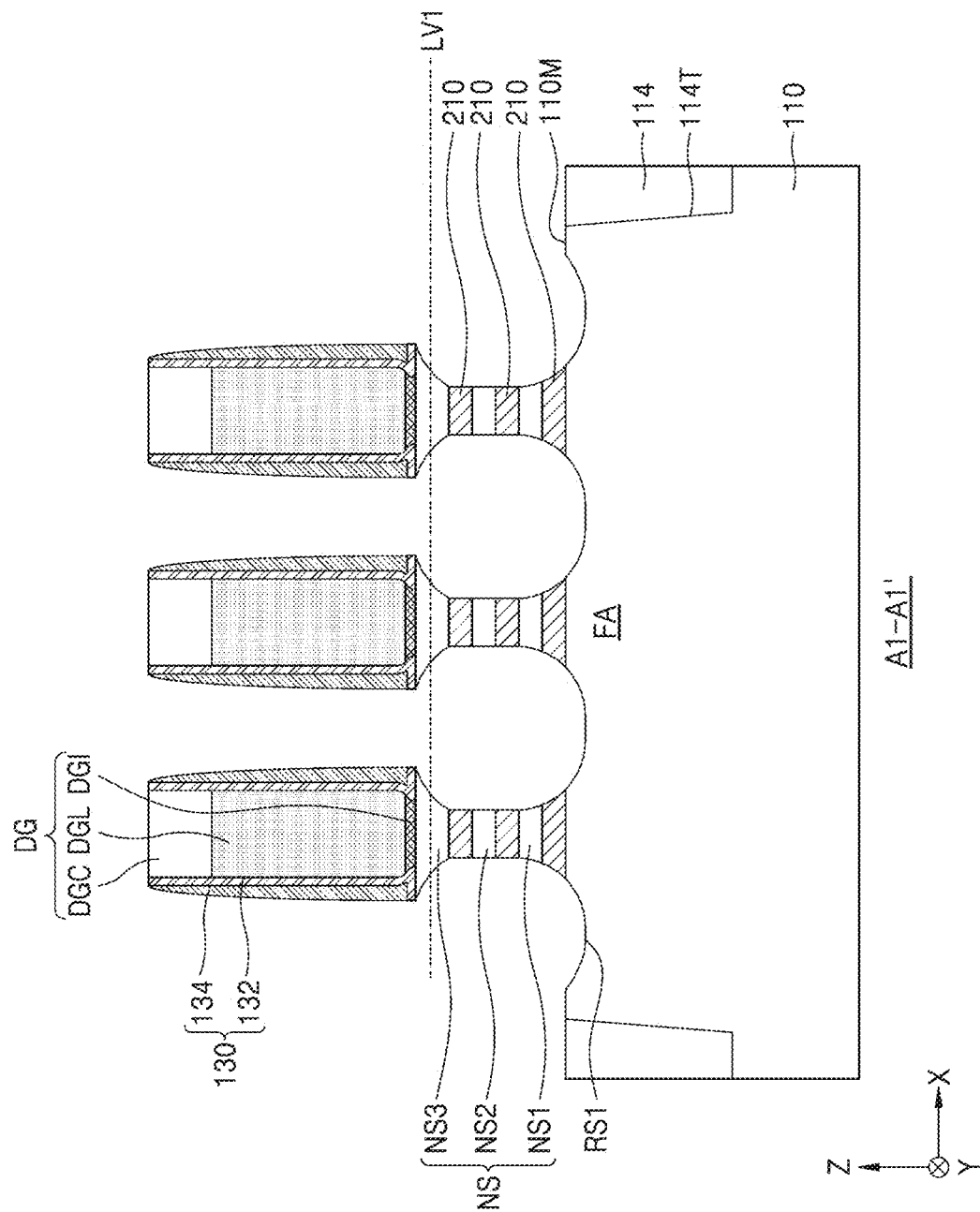

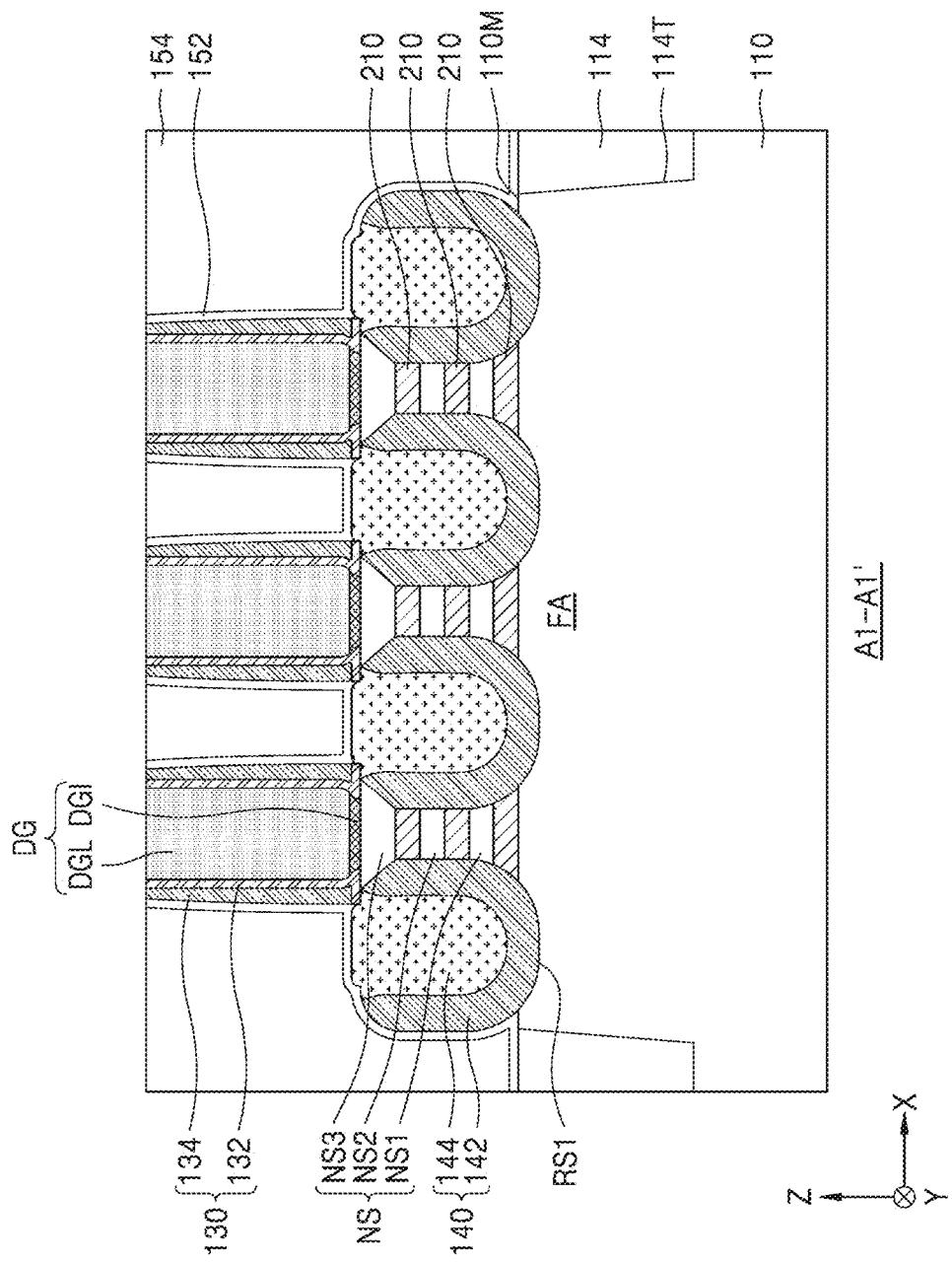

INTEGRATED CIRCUIT DEVICE AND METHOD OF MANUFACTURING THE SAME

CROSS-REFERENCE TO RELATED APPLICATION

This application is a continuation of U.S. application Ser. No. 16/841,806, filed on Apr. 7, 2020, which claims the benefit of Korean Patent Application No. 10-2019-0114366, filed on Sep. 17, 2019, in the Korean Intellectual Property Office, the disclosure of each of which is incorporated herein in its entirety by reference.

BACKGROUND

Inventive concepts relate to an integrated circuit device and a method of manufacturing the same, and more particularly, to an integrated circuit device including a transistor having a multi-gate structure, and a method of manufacturing the integrated circuit device.

In order to provide good performance and economical prices, it is necessary/desirable to increase the degree of integration of integrated circuit devices. Due to such a requirement, integrated circuit devices are downscaled, but a short channel effect of transistors occurs, causing a reduction in reliability of the integrated circuit devices. Therefore, in order to decrease the short channel effect, integrated circuit devices having a multi-gate structure like transistors of a nano-sheet or nanowire type have been proposed.

SUMMARY

Inventive concepts provide an integrated circuit device and/or a method of manufacturing the same, in which the occurrence of a defect such as an undesired connection between a source/drain region and a gate electrode is prevented or reduced in likelihood of occurrence, and an interval between a source region and a drain region adjacent to each other is reduced/minimized.

The object of inventive concepts is not limited to the aforesaid, but other objects not described herein will be clearly understood by those of ordinary skill in the art from descriptions below.

According to some example embodiments of inventive concepts, there is provided an integrated circuit device including a fin-type active region protruding from a substrate and extending in a first direction, a plurality of semiconductor patterns apart from an upper surface of the fin-type active region, a gate electrode surrounding the plurality of semiconductor patterns, the gate electrode extending in a second direction perpendicular to the first direction, the gate electrode comprising, a main gate electrode on an uppermost semiconductor pattern of the plurality of semiconductor patterns and extending in the second direction, and a sub-gate electrode between two of the plurality of semiconductor patterns, the integrated circuit comprising a spacer structure on a first sidewall of the main gate electrode and a second sidewall of the main gate electrode, and source/drain regions at respective sides of the plurality of semiconductor patterns and the source/drain regions respectively at a first side of the gate electrode and a second side of the gate electrode, the source/drain regions contacting a bottom surface of the spacer structure. A center portion of the main gate electrode has a first width in the first direction, a bottom portion of the main gate electrode has a second width in the first direction that is less than the first width, and a space between center portions of adjacent ones of the source/drain regions has a third width in the first direction that is less than the second width.

According to some example embodiments of inventive concepts, there is provided an integrated circuit device including a fin-type active region protruding from a substrate and extending in a first direction, a plurality of semiconductor patterns apart from an upper surface of the fin-type active region, a gate electrode surrounding the plurality of semiconductor patterns, the gate electrode extending in a second direction perpendicular to the first direction, the gate electrode comprising, a main gate electrode on an uppermost semiconductor pattern of the plurality of semiconductor patterns and extending in the second direction, and a sub-gate electrode between two the plurality of semiconductor patterns. The integrated circuit comprises a spacer structure disposed on a first sidewall and a second sidewall of the main gate electrode, and source/drain regions at respective sides of the plurality of semiconductor patterns and the source/drain regions respectively at a first side of the gate electrode and a second side of the gate electrode, and contacting a bottom surface of the spacer structure. The main gate electrode comprises a round inclined surface inclined from a lower portion of the main gate electrode to at least one of the first sidewall of the main gate electrode or the second sidewall of the main gate electrode, the round inclined surface being inclined relative to a third direction perpendicular to an upper surface of the substrate.

According to some example embodiments of inventive concepts, there is provided an integrated circuit device including a fin-type active region protruding from a substrate and extending in a first direction, a plurality of semiconductor patterns apart from an upper surface of the fin-type active region, a gate electrode surrounding the plurality of semiconductor patterns and extending in a second direction perpendicular to the first direction, the gate electrode comprising, a main gate electrode on an uppermost semiconductor pattern of the plurality of semiconductor patterns and extending in the second direction, and a sub-gate electrode between two of the plurality of semiconductor patterns. The integrated circuit comprises a gate dielectric layer between the plurality of semiconductor patterns and the gate electrode, a spacer structure disposed on a first sidewall of the main gate electrode and a second sidewall of the main gate electrode, a pair of source/drain regions at respective sides of the plurality of semiconductor patterns, the pair of source/drain regions respectively at a first side of the gate electrode and a second side of the gate electrode, the pair of source/drain regions contacting a bottom surface of the spacer structure, and a contact plug electrically connected to the pair of source/drain regions. A center portion of the main gate electrode has a first width in the first direction, a bottom portion of the main gate electrode has a second width in the first direction less than the first width, a space between center portions of the pair of source/drain regions has a third width in the first direction less than the second width, and the main gate electrode comprises a round inclined surface inclined from the bottom portion of the main gate electrode to at least one of the first sidewall of the main gate electrode or the second sidewall of the main gate electrode, the round inclined surface being inclined relative to a third direction perpendicular to an upper surface of the substrate.

BRIEF DESCRIPTION OF THE DRAWINGS

Embodiments of inventive concepts will be more clearly understood from the following detailed description taken in conjunction with the accompanying drawings in which.

DETAILED DESCRIPTION OF EXAMPLE EMBODIMENTS

Hereinafter, example embodiments will be described in detail with reference to the accompanying drawings.

Figure 1:
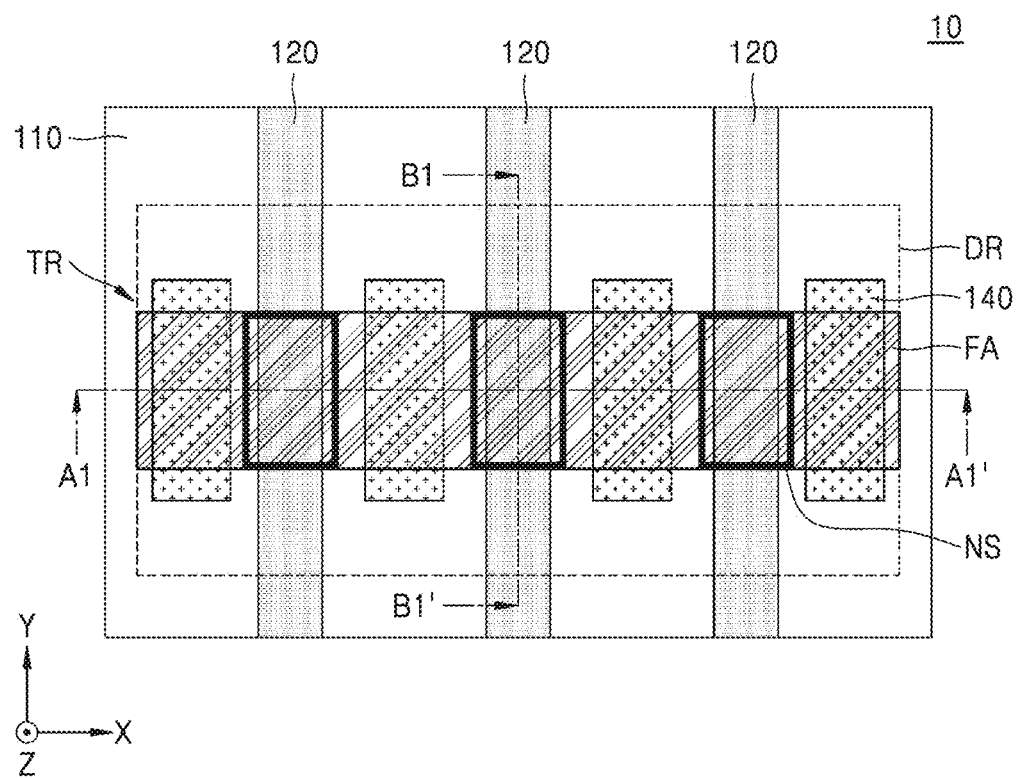
FIG. 1 is a layout illustrating an integrated circuit device according to an embodiment.
Figure 2A:
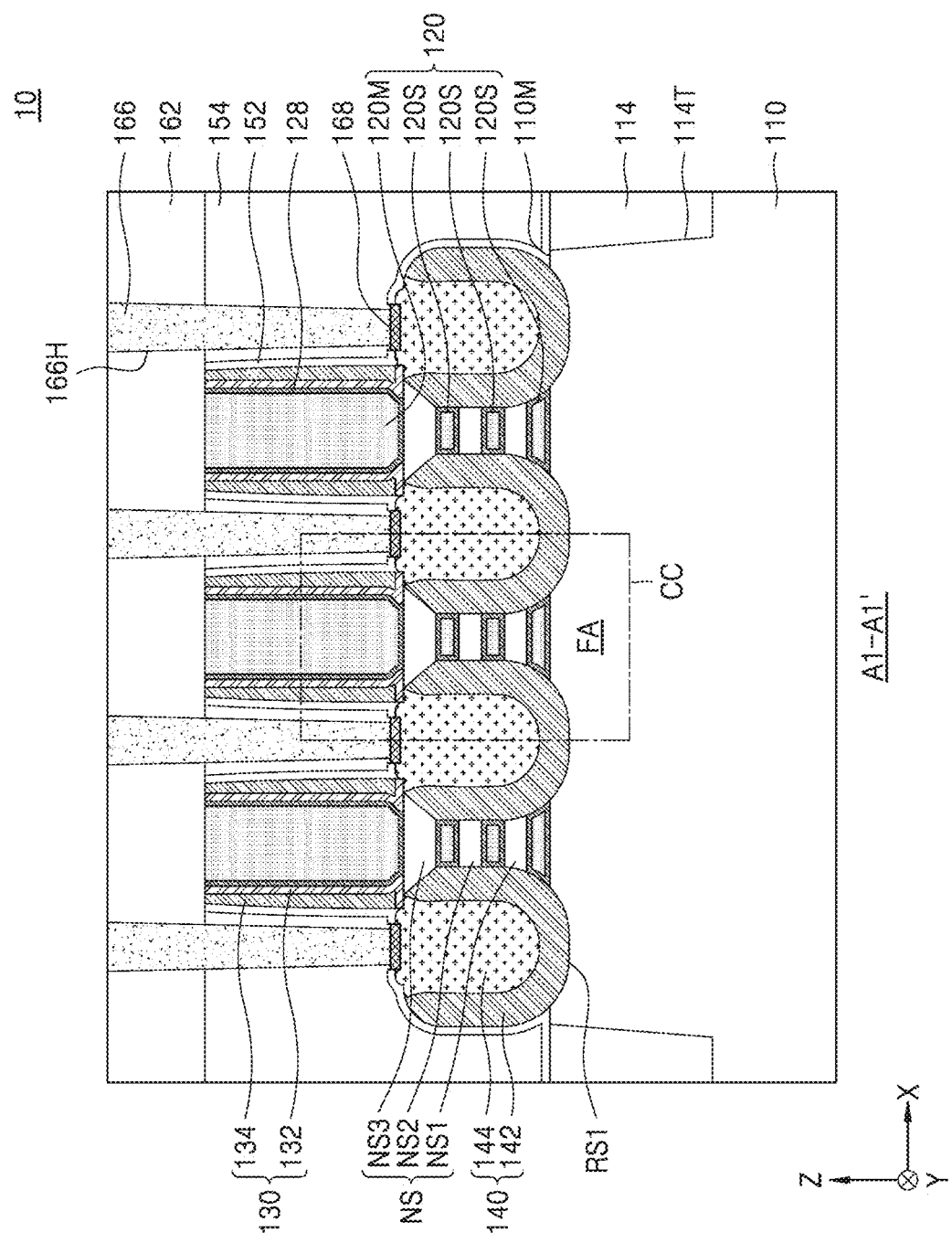
FIG. 2A is a cross-sectional view taken along line A1-A1' of FIG. 1.
Figure 2B:
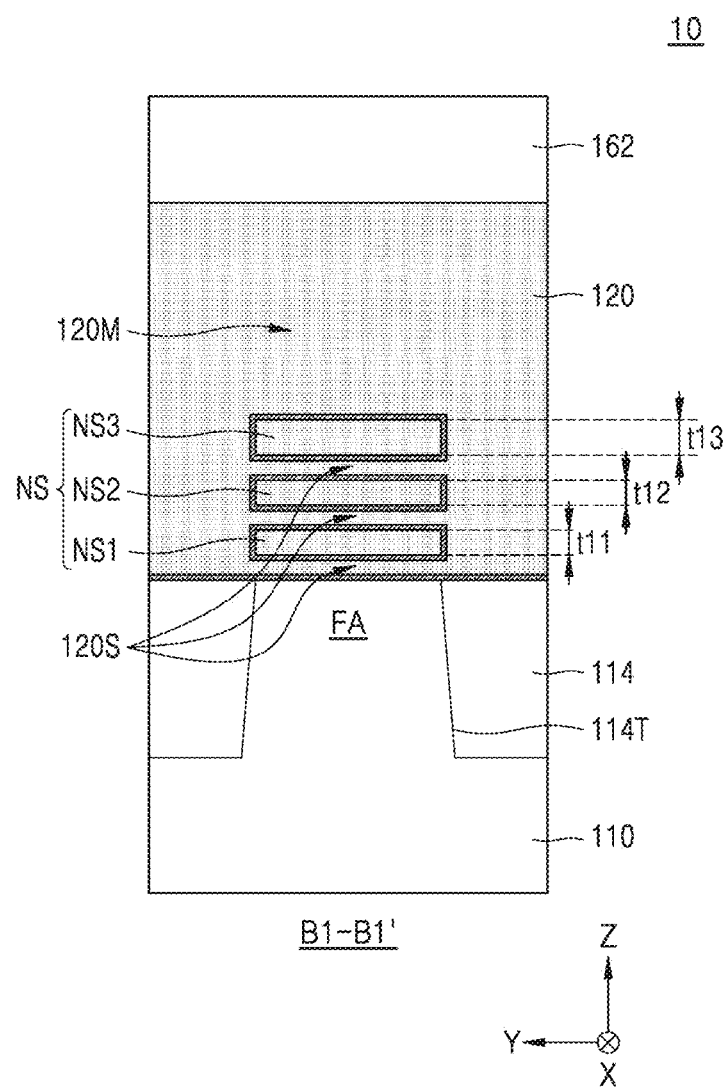
FIG. 2B is a cross-sectional view taken along line B1-B1' of FIG. 1.

FIG. 1 is a layout illustrating an integrated circuit device 10 according to an embodiment. FIG. 2A is a cross-sectional view taken along line A1-A1' of FIG. 1, FIG. 2B is a cross-sectional view taken along line B1-B1' of FIG. 1, and FIG. 2C is an enlarged view of a region CC of FIG. 2A.

Figure 2C:
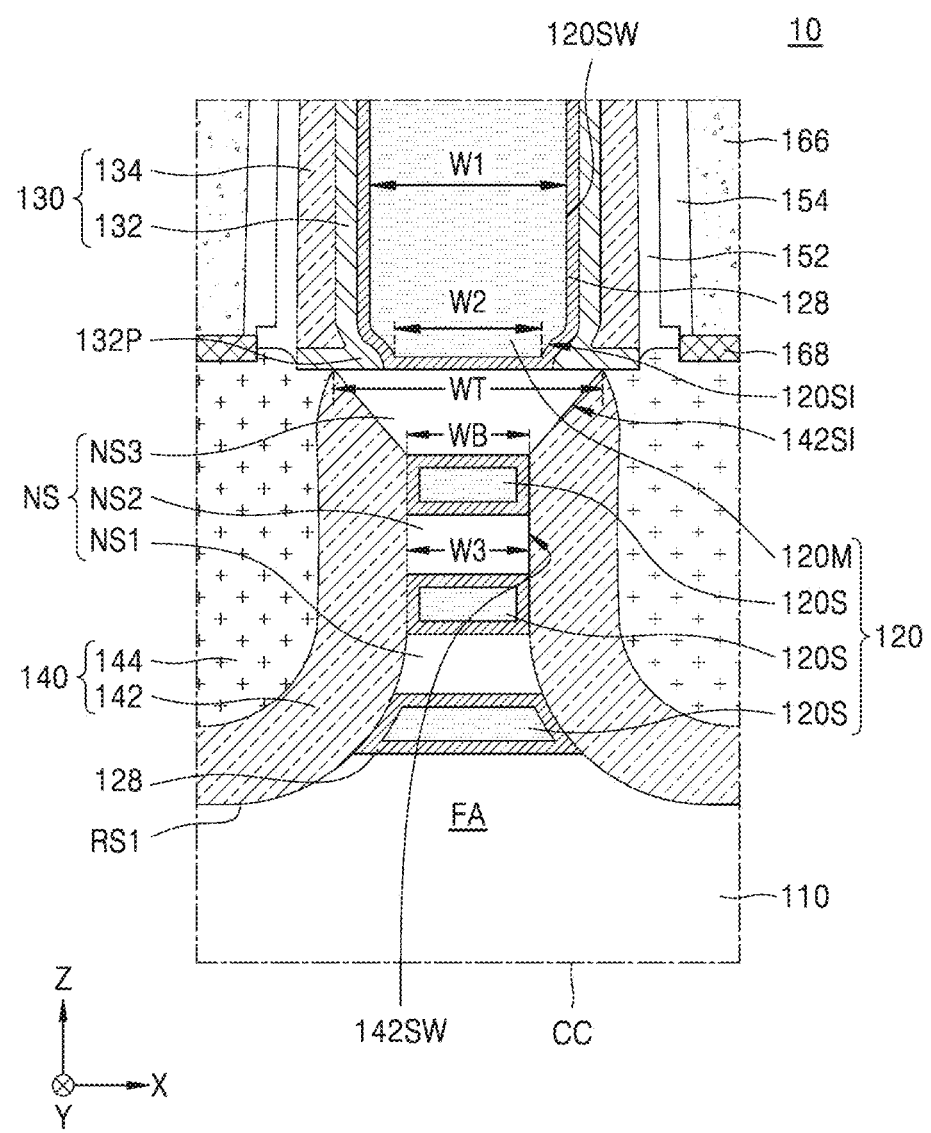
FIG. 2C is an enlarged view of region CC of FIG. 2A.

Referring to FIGS. 1 to 2C, in the integrated circuit device 10, a substrate 110 may include a fin-type active region FA provided in a device region DR.

The fin-type active region FA may configure or correspond to a transistor TR, and for example, the transistor TR may be/correspond to an NMOS transistor or a PMOS transistor.

The substrate 110 may include a semiconductor such as silicon (Si) or germanium (Ge) or a compound semiconductor such as at least one of SiGe, SiC, GaAs, InAs, or InP. In some example embodiments, the substrate 110 may include at least one of Group III-V materials and Group IV materials. The Group III-V materials may each be a binary, ternary, or quaternary compound including at least one Group III element and at least one Group V element. The Group III-V materials may each be a compound including at least one element of indium (In), gallium (Ga), and aluminum (Al) among Group III elements and at least one element of arsenic (As), phosphorus (P), and antimony (Sb) among Group V elements. For example, the Group III-V materials may be selected from among InP, $In_zGa_{1-z}As$ ($0 \leq z \leq 1$), and $Al_zGa_{1-z}As$ ($0 \leq z \leq 1$). The binary compound may be, for example, one of InP, GaAs, InAs, InSb, and GaSb. Also, the ternary compound may be, for example, one of InGaP, InGaAs, AlInAs, InGaSb, GaAsSb, and GaAsP. The Group IV material may be Si or Ge.

In some example embodiments, the Group III-V materials and the Group IV materials such as Ge may be used as a channel material for manufacturing a high speed transistor. A high performance complementary metal-insulator-semiconductor (CMOS) transistor may be formed by using a semiconductor substrate including a Group III-V material (for example, GaAs), which has a higher electron mobility than that of a Si substrate, and a semiconductor substrate including a semiconductor material (for example, Ge), which has a higher hole mobility than that of the Si substrate. In some example embodiments, in a case in which an NMOS transistor is formed on the substrate 110, the substrate 110 may include one of the above-described Group III-V materials. Alternatively, in a case in which a PMOS transistor is formed on the substrate 110, at least a portion of the substrate 110 may include Ge.

Also, the substrate 110 may have a semiconductor on insulator (SOI) structure such as a silicon on insulator and/or silicon on sapphire. The substrate 110 may include a conductive region (for example, an impurity-doped well and/or an impurity-doped structure).

The fin-type active region FA may extend in a first direction (an X direction) on the substrate 110 and may protrude in a vertical direction (a Z direction) from an upper surface of the substrate 110. An isolation trench 114T for limiting the fin-type active region FA may be provided in the substrate 110, and an isolation layer 114 may be disposed in the isolation trench 114T. In some example embodiments, the isolation layer 114 may include an isolation liner (not shown) conformally provided on an inner wall of the isolation trench 114T, and may include a gap fill insulation layer (not shown) filling an inner portion of the isolation trench 114T on the isolation liner.

In FIG. 2A, an upper surface of the isolation layer 114 is illustrated as being disposed at the same level as an upper surface of the fin-type active region FA, but is not limited thereto. Alternatively, the upper surface of the isolation layer 114 may be disposed at a lower level than the upper surface of the fin-type active region FA, and only a lower portion of a sidewall of the fin-type active region FA may be surrounded by the isolation layer 114. The isolation liner and the gap fill insulation layer may each include silicon oxide, silicon nitride, or a combination thereof.

A plurality of semiconductor patterns NS may be disposed apart from one another in the vertical direction (the Z direction) from an upper surface 110M of the substrate 110 in the fin-type active region FA. The plurality of semiconductor patterns NS may include the same material as that of the substrate 110. For example, the plurality of semiconductor patterns NS may include exactly the same material as that of the substrate 110. For example, the plurality of semiconductor patterns NS may include a semiconductor such as Si or Ge or a compound semiconductor such as SiGe, SiC, GaAs, InAs, or InP. Also, each of the plurality of semiconductor patterns NS may include a channel region.

The plurality of semiconductor patterns NS may include a first semiconductor pattern NS1, a second semiconductor pattern NS2, and a third semiconductor pattern NS3, which are arranged in this stated order from the upper surface 110M of the substrate 110. The plurality of semiconductor patterns NS may have a relatively large width in a second direction (a Y direction) and may have a relatively small thickness in the vertical direction (the Z direction), and for example, may have a nano-sheet shape.

For example, the first semiconductor pattern NS1 may have a first thickness t11 of about 1 nm to about 10 nm, the second semiconductor pattern NS2 may have a second thickness t12 of about 1 nm to about 10 nm, and the third semiconductor pattern NS3 may have a third thickness t13 of about 1 nm to about 10 nm or about 1 nm to about 20 nm.

As illustrated in FIG. 2B, the third thickness t13 of the third semiconductor pattern NS3 may be greater than the first thickness t11 of the first semiconductor pattern NS1 and the second thickness t12 of the second semiconductor pattern NS2, but inventive concepts is not limited thereto. In some embodiments, each of the plurality of semiconductor patterns NS may have a width of about 5 nm to about 100 nm in the first direction (the X direction) or the second direction (the Y direction), but example embodiments are not limited thereto.

As illustrated in FIG. 2A, the plurality of semiconductor patterns NS may be disposed apart from one another by the same distance. However, inventive concepts are not limited thereto, and a separation distance between two adjacent semiconductor patterns NS of the plurality of semiconductor patterns NS may vary. Moreover, the number of semiconductor patterns NS is not limited to the illustrations of FIGS. 2A to 2C, and may be an integer greater than three, such as four, five, six, or seven, or an integer less than three, such as one or two.

A gate electrode 120 may extend in the second direction (the Y direction) on the fin-type active region FA. The gate electrode 120 may surround the plurality of semiconductor patterns NS and may extend on the fin-type active region FA and the isolation layer 114.

The gate electrode 120 may include a main gate electrode 120M and a plurality of sub-gate electrodes 120S. The main gate electrode 120M may cover an upper surface of an uppermost semiconductor pattern NS (for example, the third semiconductor pattern NS3). The plurality of sub-gate electrodes 120S may be disposed between the fin-type active region FA and a lowermost semiconductor pattern NS, and may each be disposed between two adjacent semiconductor patterns NS of the plurality of semiconductor patterns NS.

For example, the plurality of sub-gate electrodes 120S may be disposed between the fin-type active region FA and the first semiconductor pattern NS1, between the first semiconductor pattern NS1 and the second semiconductor pattern NS2, and between the second semiconductor pattern NS2 and the third semiconductor pattern NS3. The main gate electrode 120M may be disposed on an upper surface of the third semiconductor pattern NS3 and the isolation layer 114, and may be connected to the plurality of sub-gate electrodes 120S.

The main gate electrode 120M may include a round inclined surface 120SI which is inclined in the third direction (the Z direction) perpendicular to the upper surface 110M of the substrate 110. For example, the round inclined surface 120SI may not be perpendicular to the upper surface 110M of the substrate 110, and may be inclined with respect to a bottom portion of the main gate electrode 120M. The round inclined surface 120SI may connect/be connected to a vertical sidewall 120SW of the main gate electrode 120M and may extend by a certain height from the bottom portion of the main gate electrode 120M. For example, a height of the round inclined surface 120SI in the third direction (the Z direction) may be about 1% to about 20% of a height of the main gate electrode 120M, but example embodiments are not limited thereto.

The gate electrode 120 may include a work function control layer (not shown) and/or a buried conductive layer (not shown). The work function control layer may be disposed on an upper surface of each of the plurality of semiconductor patterns NS, and the buried control layer may be disposed on the work function control layer. In some example embodiments, the work function control layer and the buried conductive layer may each include Al, copper (Cu), titanium (Ti), tantalum (Ta), tungsten (W), molybdenum (Mo), TaN, NiSi, CoSi, TiN, WN, TiAl, TiAlC, TiAlN, TaCN, TaC, TaSiN, or a combination thereof, and/or may include materials different from one another, but example embodiments are not limited thereto.

A gate dielectric layer 128 may be disposed between the gate electrode 120 and the plurality of semiconductor patterns NS. The gate dielectric layer 128 may be disposed, e.g. may be conformally disposed on the upper surface and a sidewall of each of the plurality of semiconductor patterns NS.

The gate dielectric layer 128 may be provided in a stacked structure including an interface layer (not shown) and/or a high-k dielectric layer (not shown). The interface layer may repair or help to repair an interface defect between the upper surface of the fin-type active region FA and the high-k dielectric layer in a surface of each of the plurality of semiconductor patterns NS.

In some example embodiments, the interface layer may include a low dielectric material layer (for example, silicon oxide, silicon oxynitride, Ga oxide, Ge oxide, or a combination thereof) having a dielectric constant of about 9 or less. Alternatively or additionally, the interface layer may include silicate, a combination of silicate and silicon oxide, or a combination of silicate and silicon oxynitride. However, the interface layer may be omitted.

The high-k dielectric layer may include a material having a dielectric constant which is greater than that of silicon oxide. For example, the high-k dielectric layer may have a dielectric constant of about 10 to about 25. The high-k dielectric layer may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, and a combination thereof, but a material included in the high-k dielectric layer is not limited thereto.

A spacer structure 130 may be disposed on each of both sidewalls of the gate electrode 120. The gate dielectric layer 128 may be disposed between the gate electrode 120 and the spacer structure 130. The spacer structure 130 may include a first spacer 132 and a second spacer 134, which are sequentially disposed on a sidewall of the main gate electrode 120M.

As illustrated in FIG. 2C, the first spacer 132 may be disposed, e.g. conformally disposed on the sidewall of the main gate electrode 120M and the third semiconductor pattern NS3 adjacent thereto. A bottom portion of the first spacer 132 may extend in a horizontal direction and may be disposed on an upper surface of the third semiconductor pattern NS3 and between the second spacer 134 and the third semiconductor pattern NS3. Each of the first and second spacers 132 and 134 may include silicon nitride or silicon oxynitride and/or may include materials different from one another; however, example embodiments are not limited thereto.

A recess region RS1 may be provided in the fin-type active region FA at both sides of each of the plurality of semiconductor patterns NS, and a source/drain region 140 may fill an inner portion of the recess region RS1. The source/drain region 140 may be connected to both ends of the plurality of semiconductor patterns NS.

The source/drain region 140 may include a first semiconductor layer 142 and a second semiconductor layer 144, which are sequentially disposed on an inner wall of the recess region RS1. The first and second semiconductor layers 142 and 144 may grow, e.g. may epitaxially grow, from the fin-type active region FA and the plurality of semiconductor patterns NS through a selective epitaxial growth (SEG) process. The SEG process may include a homogenous epitaxial process; alternatively or additionally, the SEG process may include a heterogeneous epitaxial process. Furthermore, the source/drain region 140 may include dopants, such as at least one of boron, phosphorus, arsenic, or carbon. The dopants may be implanted into the source/drain region 140, and/or may be incorporated into the source/drain region 140 during the SEG process.

In some example embodiments, the first semiconductor layer 142 may be formed on an inner wall of the recess region RS1 to have a certain thickness and may contact the plurality of semiconductor patterns NS and the gate dielectric layer 128.

The first semiconductor layer 142 may include an inclined surface 142SI which is provided in a direction from an upper portion of the first semiconductor layer 142 to a center portion of the first semiconductor layer 142. At least a portion of the inclined surface 142SI of the first semiconductor layer 142 may vertically overlap a vertical sidewall 120SW of the main gate electrode 120M, and another portion of the inclined surface 142SI of the first semiconductor layer 142 may be disposed to vertically overlap the bottom portion of the main gate electrode 120M. For example, an upper surface of the first semiconductor layer 142 may contact, e.g. directly contact, a bottom surface of the spacer structure 130.

The second semiconductor layer 144 may be formed to fill the recess region RS1 on the first semiconductor layer 142. A portion of an upper surface of the second semiconductor layer 144 may contact, e.g. directly contact, the bottom surface of the spacer structure 130. Another portion of the upper surface of the second semiconductor layer 144 may protrude up to a level which is higher than the bottom surface of the spacer structure 130. Accordingly, the second semiconductor layer 144 may fill the recess region RS1, and an edge of the second semiconductor layer 144 may extend to a portion under the spacer structure 130 and may vertically overlap the spacer structure 130.

The first and second semiconductor layers 142 and 144 may each include at least one of an epitaxial-grown Si layer (i.e. an epitaxial Si layer), an epitaxial-grown SiC layer (i.e. an epitaxial SiC layer), an epitaxial-grown SiGe layer (i.e. an epitaxial SiGe layer), or an epitaxial-grown SiP layer (i.e. an epitaxial SiP layer).

In some example embodiments, the first and second semiconductor layers 142 and 144 may each include a Si layer, and concentrations of impurities doped on the first and second semiconductor layers 142 and 144 may differ.

Alternatively or additionally, the first and second semiconductor layers 142 and 144 may each include a SiGe layer, and a content of Ge included in the first semiconductor layer 142 may differ from a content of Ge included in the second semiconductor layer 144. For example, a concentration of Ge included in the first semiconductor layer 142 may differ from, e.g. be greater than or less than, a concentration of Ge included in the second semiconductor layer 144. Furthermore, impurities such as carbon (C) may be further included/incorporated in the first semiconductor layer 142.

Alternatively or additionally, one of the first and second semiconductor layers 142 and 144 may include a Si layer, and the other of the first and second semiconductor layers 142 and 144 may include a SiGe layer. However, inventive concepts is not limited thereto. Alternatively or additionally, at least one additional semiconductor layer may be further provided between the first and second semiconductor layers 142 and 144.

As illustrated in FIG. 2C, the recess region RS1 may have a width which is greater in a center portion thereof than an uppermost portion thereof. Therefore, the source/drain region 140 filling the recess region 140 may have a width which is greater in a center portion thereof than an uppermost portion thereof, and at least a portion of each of the plurality of semiconductor patterns NS contacting the source/drain region 140 may include an inclined sidewall.

As illustrated in FIG. 2C, a center portion of the main gate electrode 120M may have a first width W1 in the first direction (the X direction), and the bottom portion of the main gate electrode 120M may have a second width W2 less than the first width W1 in the first direction (the X direction). The round inclined surface 120SI may be formed at the bottom portion of the main gate electrode 120M, and the first spacer 132 of the spacer structure 130 may fill a space defined by the round inclined surface 120SI and an upper surface of the uppermost semiconductor pattern NS.

For example, the first spacer 132 may include a round protrusion portion 132P provided at a bottom portion thereof, and the round protrusion portion 132P may fill a space defined by the round inclined surface 120SI and the upper surface of the uppermost semiconductor pattern NS. The gate dielectric layer 128 may be disposed between the round inclined surface 120SI and the round protrusion portion 132P. The round inclined surface 120SI of the main gate electrode 120M may vertically overlap a portion (e.g., the round protrusion portion 132P of the first spacer 132) of the spacer structure 130.

As illustrated in FIG. 2C, an upper portion of the source/drain region 140 may include an inclined surface 142SI, and the uppermost semiconductor pattern NS (for example, the third semiconductor pattern NS3) connected to the source/drain region 140 may include a pair of inclined sidewalls conforming to a shape of the inclined surface 142SI of the source/drain region 140. For example, each of the pair of inclined sidewalls may contact the first semiconductor layer 142 of the source/drain region 140. An upper portion of the uppermost semiconductor pattern NS may have a top width WT in the first direction (the X direction), and a bottom portion of the uppermost semiconductor pattern NS may have a bottom width WB less than the top width WT in the first direction (the X direction). For example, the uppermost semiconductor pattern NS may include the pair of inclined sidewalls.

A center portion of the source/drain region 140 may include a vertical surface 142SW connecting from the inclined surface 142SI of the upper portion thereof. A space between center portions of source/drain regions 140 adjacent to each other may have a third width W3 in the first direction (the X direction). For example, a distance between vertical surfaces 142SW of source/drain regions 140 adjacent to each other may be the third width W3, and the third width W3 may be substantially the same as the bottom width WB of the uppermost semiconductor pattern NS. Additionally or alternatively, the third width W3 of the source/drain region 140 may be less than the second width W2 of the bottom portion of the main gate electrode 120M.

As illustrated in FIG. 2C, the uppermost semiconductor pattern NS may include a cross-sectional surface having an inverted trapezoidal shape, and the top width WT of the uppermost semiconductor pattern NS may be greater than the second width W2 of the bottom portion of the main gate electrode 120M. Alternatively or additionally, the round protrusion portion 132P of the first spacer 132 may be disposed between the bottom portion of the main gate electrode 120M and the source/drain region 140, and thus, comparing with a case where the main gate electrode 120M includes the vertical sidewall provided at the bottom portion thereof, a separation distance between the main gate electrode 120M and the source/drain region 140 may be relatively large.

As described above, since the separation distance between the main gate electrode 120M and the source/drain region 140 is relatively large, a leakage current, such as a gate-induced leakage current (GIDL), between the bottom portion of the main gate electrode 120M and the source/drain region 140 may be prevented or reduced. Moreover, a process error such as an undesired connection between a dummy gate structure DG (see FIG. 13A) and the source/drain region 140 or an undesired connection between the gate electrode 120 and the source/drain region 140 may be prevented or reduced in likelihood of occurrence, in a process of forming the source/drain region 140 or a process of removing a dummy gate structure DG (see FIG. 13A) and forming the gate electrode 120.

An insulation liner 152 and an inter-gate insulation layer 154 may be sequentially formed on both sidewalls of the spacer structure 130, the source/drain region 140, and the isolation layer 114. An upper insulation layer 162 may be disposed on the gate electrode 120 and the inter-gate insulation layer 154. A contact plug 166 may be disposed in a contact hole 166H which passes through the upper insulation layer 162 and exposes an upper surface of the source/drain region 140, and a metal silicide layer 168 may be provided between the contact plug 166 and the source/drain region 140. For example, the metal silicide layer 168 may include titanium silicide and/or cobalt silicide, but example embodiments are not limited thereto.

Although not shown, a wiring layer (not shown) and a via (not shown) connected to the contact plug 166 and the gate electrode 120 may be further provided on the upper insulation layer 162.

Generally, a dummy gate structure may be formed on a plurality of semiconductor patterns, a recess region may be formed by removing a portion of a semiconductor pattern at both sides of the dummy gate structure, and a source/drain region may be formed in the recess region. However, a separation distance between the recess region and the dummy gate structure may be relatively small at an edge portion of each of the semiconductor patterns, reducing process margins and potentially causing a process error such as an undesired connection between the dummy gate structure and the source/drain region and/or an undesired connection between the gate electrode and the source/drain region. Moreover, since the separation distance between the recess region and the dummy gate structure is relatively small at the edge portion of each semiconductor pattern, a relatively large leakage current, such as a GIDL current, may occur between the gate electrode and the source/drain region.

However, in the integrated circuit device 10 according to some example embodiments, the round inclined surface 120SI may be provided at the bottom portion of the main gate electrode 120M, and thus, a relatively large separation distance may be secured between the dummy gate structure DG (see FIG. 13A) and the source/drain region 140 or between the gate electrode 120 and the source/drain region 140. Accordingly, a process error such as an undesired connection between the dummy gate structure DG (see FIG. 13A) and the source/drain region 140 and/or an undesired connection between the gate electrode 120 and the source/drain region 140 may be considerably prevented. Alternatively or additionally, a leakage current between the source/drain region 140 and the main gate electrode 120M may be considerably prevented.

Also, in the integrated circuit device 10 according to some example embodiments, a center portion of the source/drain region 140 may include the vertical surface 142SW connecting from the inclined surface 142SI of the upper portion thereof, and a separation distance between center portions of source/drain regions 140 adjacent to each other may be less than a width of the bottom portion of the main gate electrode 120M. Therefore, since a separation distance between source/drain regions 140 adjacent to each other is reduced, an operating voltage may relatively decrease and an operating current may relatively increase. For example, an electrical characteristic of the integrated circuit device 10 may be enhanced.

Therefore, in the integrated circuit device 10 according to some example embodiments, a defect such as an undesired connection between the gate electrode 120 and the source/drain region 140 may be prevented or reduced in likelihood of occurrence, and a separation distance between source/drain regions 140 adjacent to each other may be reduced, thereby enhancing electrical characteristic and/or increasing productivity.

Figure 3:
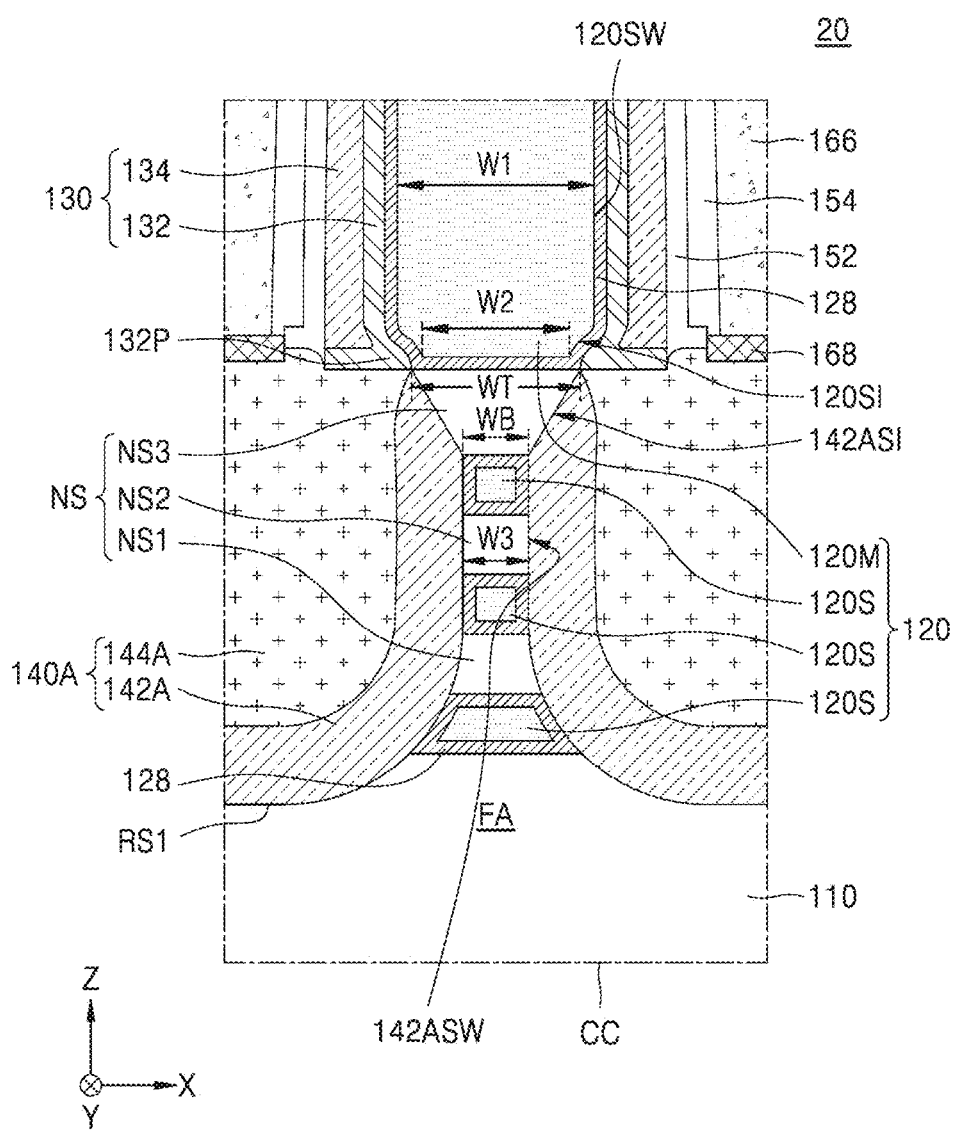
FIG. 3 is a cross-sectional view illustrating an integrated circuit device according to an embodiment.
Figure 4:
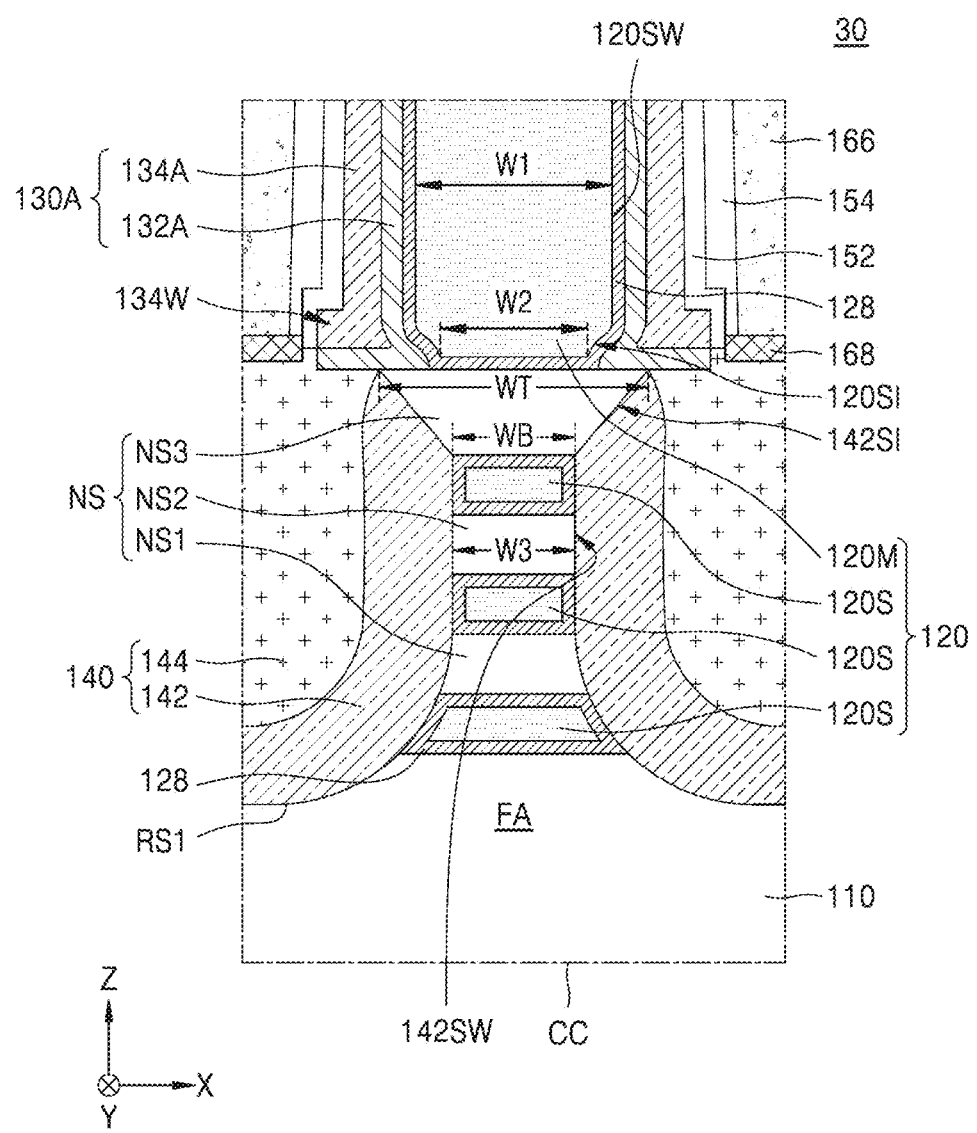
FIG. 4 is a cross-sectional view illustrating an integrated circuit device according to an embodiment.
Figure 5:
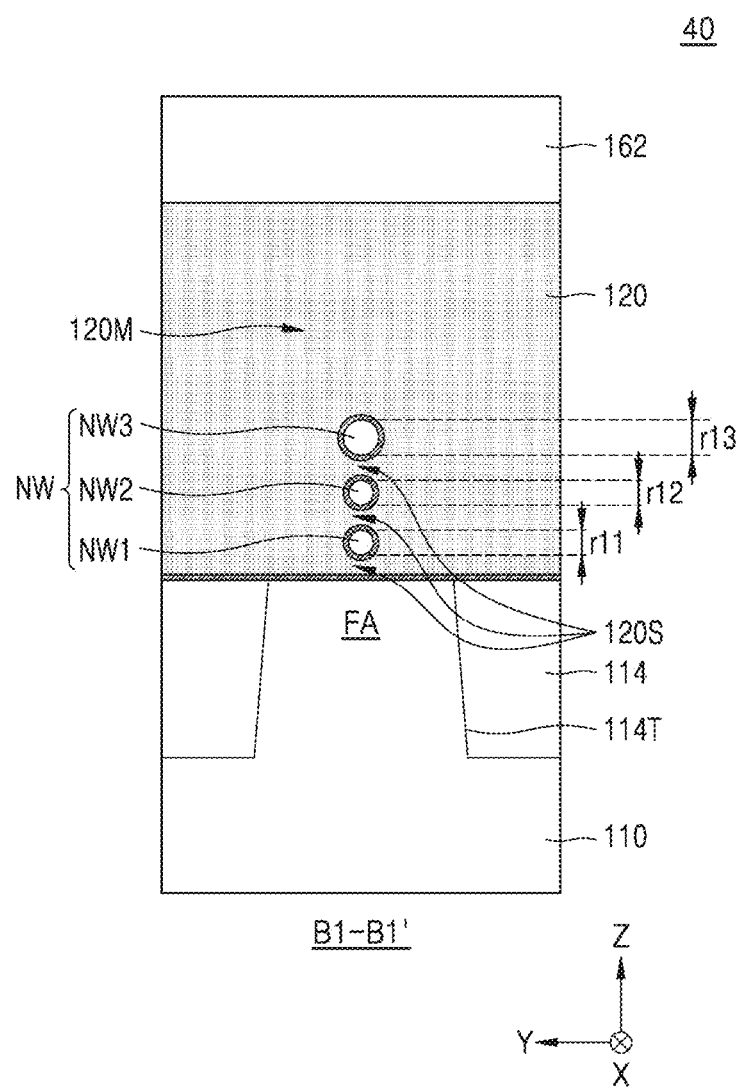
FIG. 5 is a cross-sectional view illustrating an integrated circuit device according to an embodiment.

FIGS. 3 to 5 are cross-sectional views illustrating an integrated circuit device according to some example embodiments.

Most elements of each of integrated circuit devices 20, 30, and 40 described below and a material of each of the elements are substantially the same as or similar to the descriptions of FIGS. 1 to 2C. Therefore, for convenience of description, a difference with the above-described integrated circuit device 10 will be mainly described below.

Referring to FIG. 3, in an integrated circuit device 20 according to some example embodiments, a round inclined surface 120SI may be provided at a bottom portion of a main gate electrode 120M.

A first spacer 132 may include a round protrusion portion 132P provided at a bottom portion thereof, and the round protrusion portion 132P may fill a space defined by the round inclined surface 120SI and an upper surface of an uppermost semiconductor pattern NS. A gate dielectric layer 128 may be disposed between the round inclined surface 120SI and the round protrusion portion 132P. The round inclined surface 120SI of the main gate electrode 120M may vertically overlap a portion (e.g., the round protrusion portion 132P of the first spacer 132) of a spacer structure 130.

As illustrated in FIG. 3, an upper portion of a source/drain region 140A may include an inclined surface 142ASI, and the uppermost semiconductor pattern NS connected to the source/drain region 140A may include a pair of inclined sidewalls conforming to a shape of the inclined surface 142ASI of the source/drain region 140A. For example, each of the pair of inclined sidewalls may contact a first semiconductor layer 142A of the source/drain region 140A.

A center portion of the source/drain region 140A may include a vertical surface 142ASW connecting from the inclined surface 142ASI of the upper portion thereof. A space between center portions of source/drain regions 140A adjacent to each other may have a third width W3 in a first direction (an X direction). For example, a distance between vertical surfaces 142ASW of source/drain regions 140A adjacent to each other may be the third width W3, and the third width W3 may be substantially the same as a bottom width WB of the uppermost semiconductor pattern NS. Also, the third width W3 of the source/drain region 140A may be less than a second width W2 of the bottom portion of the main gate electrode 120M.

An end point of the inclined surface 142ASI of the source/drain region 140A may contact an end point of the round protrusion portion 132P of the first spacer 132. For example, a vertex portion/vertex point of an upper surface of a first semiconductor layer 142A may contact a portion which protrudes in a direction from the round protrusion portion 132P of the first spacer 132 to the main gate electrode 120M. Accordingly, a lower surface of the first spacer 132 may contact an upper surface of a second semiconductor layer 144A.

In the integrated circuit device 20 according to some example embodiments, a center portion of the source/drain region 140A may include a vertical surface 142ASW connecting from the inclined surface 142ASI of the upper portion thereof, and a separation distance between center portions of source/drain regions 140A adjacent to each other may be far less than a width of the bottom portion of the main gate electrode 120M. Therefore, since a separation distance between source/drain regions 140A adjacent to each other is reduced, an operating voltage may relatively decrease and/or an operating current may relatively increase. For example, an electrical characteristic of the integrated circuit device 20 may be enhanced.

Referring to FIG. 4, in an integrated circuit device 30 according to some example embodiments, a spacer structure 130A may include a first spacer 132A and a second spacer 134A, which are sequentially disposed on a sidewall of a gate electrode 120, and a bottom portion of the first spacer 132A and a bottom portion of the second spacer 134A may extend in a horizontal direction on an upper surface of each of a plurality of semiconductor patterns NS.

The second spacer 134A may include a lateral extension portion 134W, and the bottom portion of the first spacer 132A may be disposed between the lateral extension portion 134W and an uppermost semiconductor pattern NS.

In the integrated circuit 30 according to some example embodiments, since a separation distance between a source/drain region 140 and a main gate electrode 120M is relatively large due to the spacer structure 130A where a width of a bottom portion thereof increases, a leakage current, such as GIDL, between the source/drain region 140 and the main gate electrode 120M may be prevented or reduced.

Referring to FIG. 5, in an integrated circuit device 40 according to some example embodiments, a plurality of semiconductor patterns NW may include a first semiconductor pattern NW1, a second semiconductor pattern NW2, and a third semiconductor pattern NW3, which are arranged in this stated order from an upper surface 110M of a substrate 110.

The plurality of semiconductor patterns NW may each include a circular cross-sectional surface and/or an oval cross-sectional surface, and for example, may each have a nanowire shape. Also, the first semiconductor pattern NW1 may have a diameter r11 of about 1 nm to about 10 nm, the second semiconductor pattern NW2 may have a diameter r12 of about 1 nm to about 10 nm, and the third semiconductor pattern NW3 may have a diameter r13 of about 1 nm to about 20 nm.

As illustrated in FIG. 5, the diameter r13 of the third semiconductor pattern NW3 may be greater than the diameter r11 of the first semiconductor pattern NW1 and the diameter r12 of the second semiconductor pattern NW2; however, example embodiments are not limited thereto.

FIGS. 6 to 15B are cross-sectional views illustrating a method of manufacturing an integrated circuit device according to some example embodiments.

Figure 6:
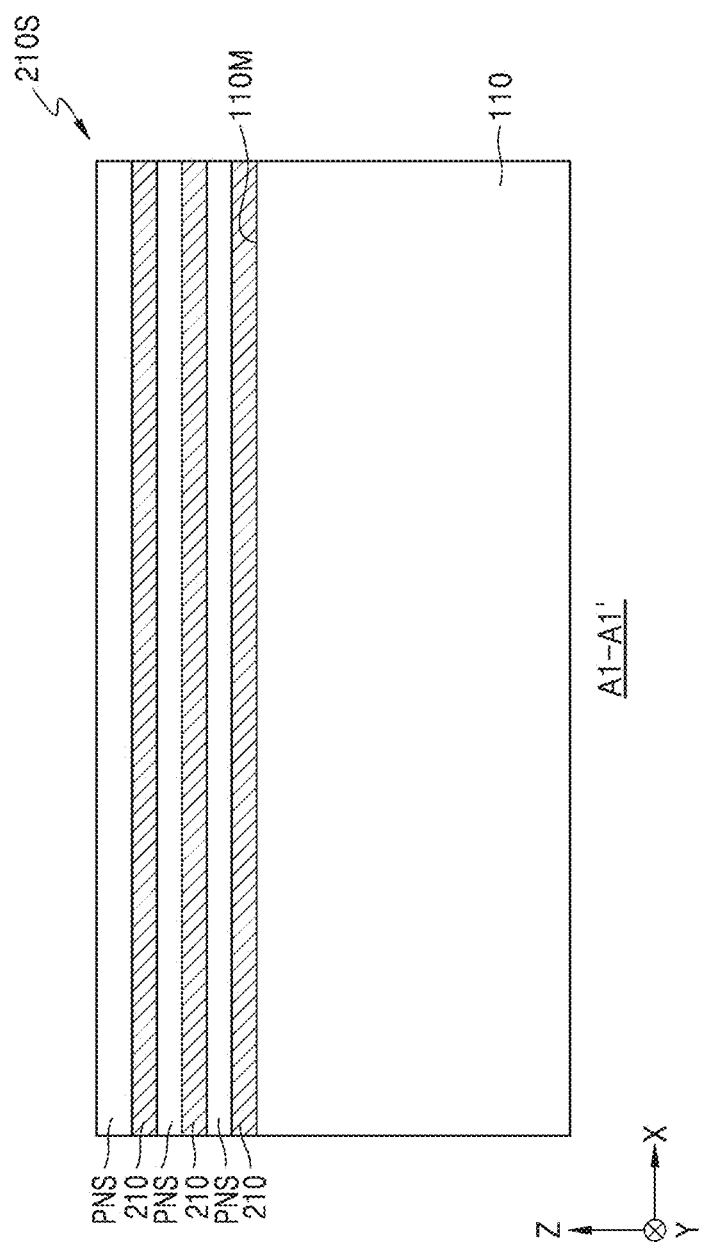
FIGS. 6 to 15B are cross-sectional views illustrating a method of manufacturing an integrated circuit device according to an embodiment.
Figure 7A:
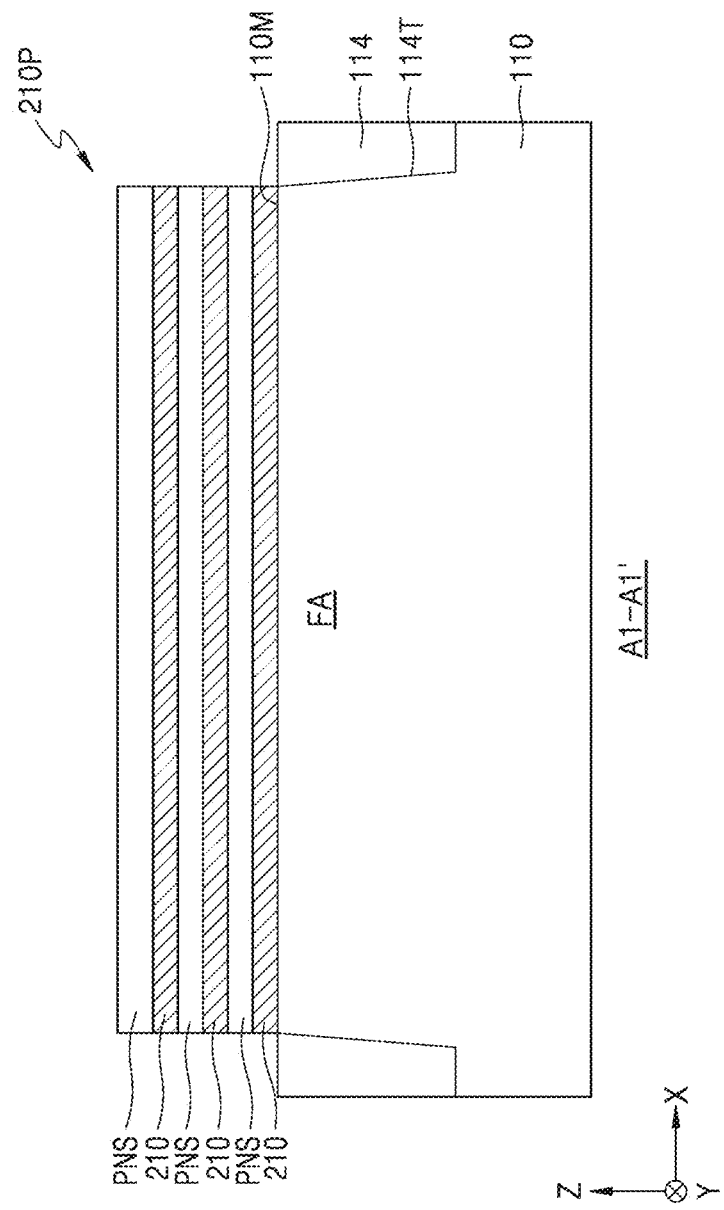
Figure 12B:
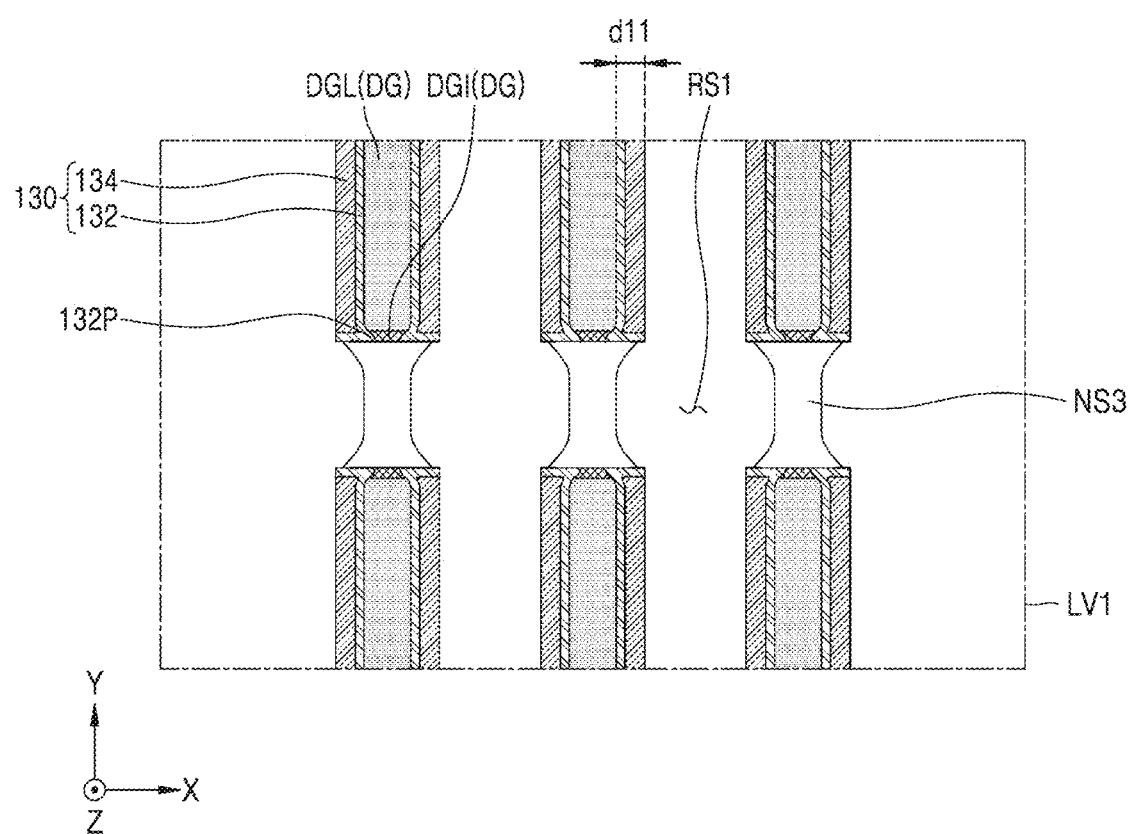
Figure 13B:
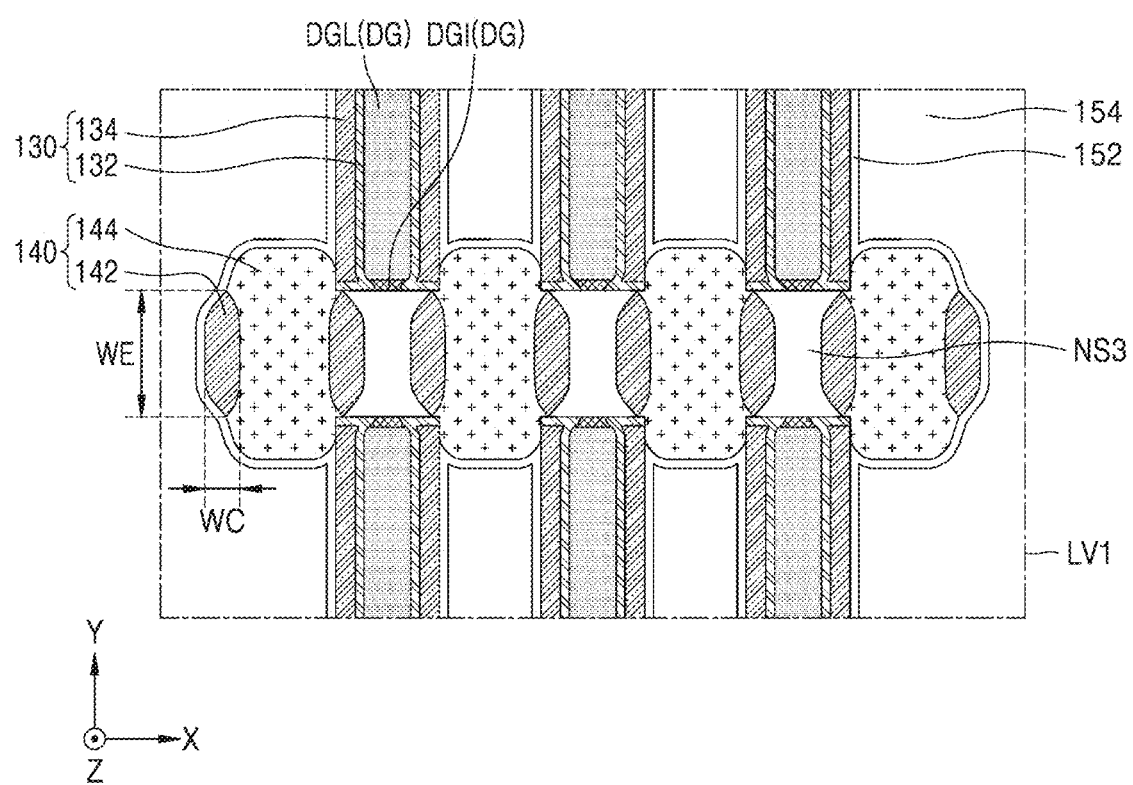

In detail, FIG. 6, FIG. 7A. FIGS. 8A, 9, 10, 11, 12A, 13A, 14A, and 15A illustrate vertical cross-sectional views corresponding to a cross-sectional surface taken along line A1-A1' of FIG. 1 in a process sequence, FIGS. 7B, 8B, 14B, and 15B illustrate vertical cross-sectional views corresponding to a cross-sectional surface taken along line B1-B1' of FIG. 1 in a process sequence, and FIGS. 12B and 13B illustrate horizontal cross-sectional views at a first level LV1 of FIGS. 12A and 13A.

Referring to FIG. 6, a sacrificial layer 210 and a channel semiconductor layer PNS may be alternately and sequentially formed on an upper surface 110M of a substrate 110, thereby forming a sacrificial layer stack 210S.

The sacrificial layer 210 and the channel semiconductor layer PNS may be formed by an epitaxy process. In some example embodiments, the sacrificial layer 210 and the channel semiconductor layer PNS may each include a material having etch selectivity with respect to each other. For example, each of the sacrificial layer 210 and the channel semiconductor layer PNS may include a single crystalline layer including a Group IV semiconductor and at least one of a Group IV-IV compound semiconductor or a Group III-V compound semiconductor, and the sacrificial layer 210 and the channel semiconductor layer PNS may include different materials. For example, the sacrificial layer 210 may include SiGe, and the channel semiconductor layer PNS may include crystalline silicon (e.g. single crystal silicon without any further germanium).

In some example embodiments, the epitaxy process may be or include a molecular beam epitaxy process and/or a chemical vapor deposition (CVD) process such as a vapor-phase epitaxy (VPE) process or an ultra-high vacuum chemical vapor deposition (UHV-CVD) process, or a combination thereof. In the epitaxy process, a liquid and/or gaseous precursor may be used as a precursor needed for forming the sacrificial layer 210 and the channel semiconductor layer PNS.

Figure 7B:
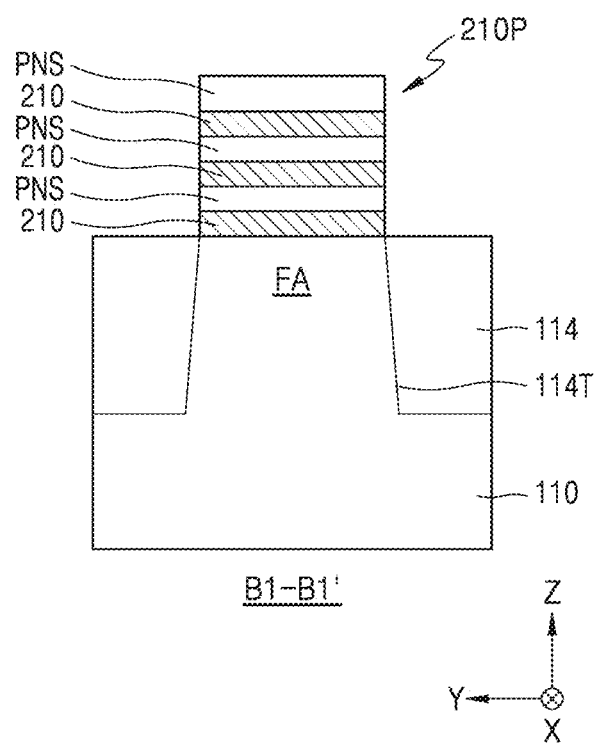

Referring to FIGS. 7A and 7B, a hard mask pattern (not shown) extending by a certain length in a first direction (an X direction) may be formed on the channel semiconductor layer PNS, and then, by using the hard mask pattern as an etch mask, a sacrificial layer pattern 210P and an isolation trench 114T may be formed by etching the sacrificial layer 210, the channel semiconductor layer PNS, and the substrate 110.

Subsequently, an insulating material may be filled into the isolation trench 114T, and then, an isolation layer 114 filled into the isolation trench 114T may be formed by planarizing an upper portion of the insulating material, e.g. by planarizing with a chemical mechanical planarization (CMP) process and/or an etch-back process. A fin-type active region FA may be defined in the substrate 110 by the isolation layer 114.

Subsequently, the hard mask pattern remaining on the sacrificial layer pattern 210P may be removed, and then, a recess process of removing a portion of the isolation layer 114 by a certain thickness from an upper surface thereof may be performed. In some example embodiments, the recess process may be performed on the upper surface of the isolation layer 114 so that the upper surface of the isolation layer 114 is disposed at the same level as an upper surface 110M of the substrate 110. Alternatively or additionally, a portion of a sidewall of the fin-type active region FA may be exposed by performing the recess process so that the upper surface of the isolation layer 114 is disposed at a lower level than the upper surface 110M of the substrate 110.

Figure 8B:
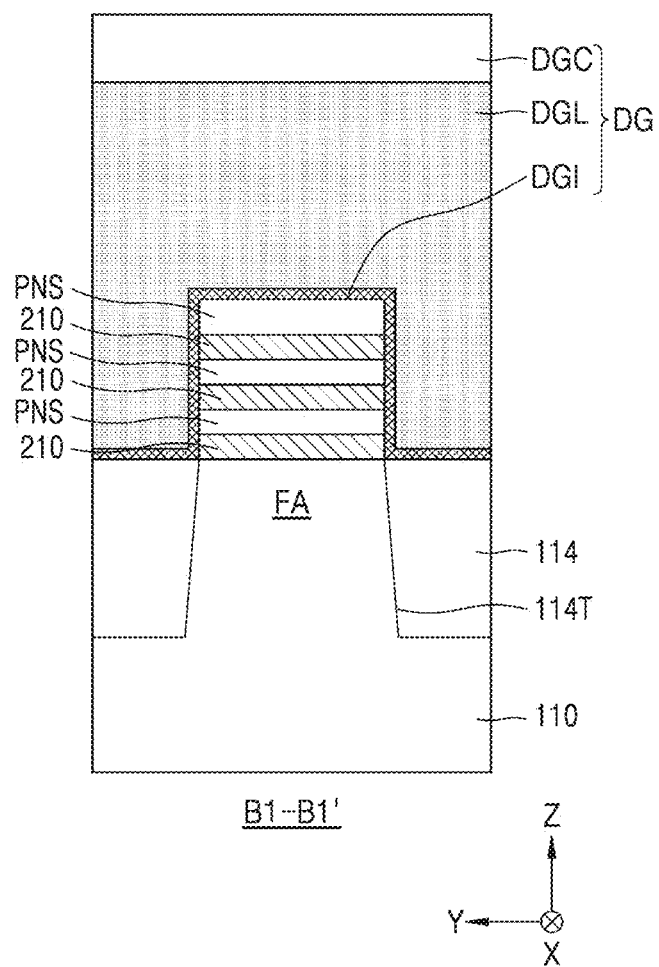

Referring to FIGS. 8A and 8B, a dummy gate structure DG may be formed on the sacrificial layer pattern 210P and the isolation layer 114. The dummy gate structure DG may include a dummy gate dielectric layer DGI, a dummy gate line DGL, and a dummy gate capping layer DGC.

For example, the dummy gate line DGL may include doped or undoped polysilicon, and the dummy gate capping layer DGC may include silicon nitride. The dummy gate dielectric layer DGI may include a material having etch selectivity corresponding to the dummy gate line DGL, and for example, may include at least one material selected from among thermal oxide, silicon oxide, or silicon nitride.

The dummy gate dielectric layer DGI may include a protrusion sidewall DGI_OS which protrudes to an outer portion of a sidewall of the dummy gate structure DG. For example, when a height of the dummy gate structure DG is relatively large, a portion of the dummy gate dielectric layer DGI may remain without being removed in an etching atmosphere, and thus, the protrusion sidewall DGI_OS of the dummy gate dielectric layer DGI may protrude more outward than a sidewall of the dummy gate line DGL.

Figure 9:
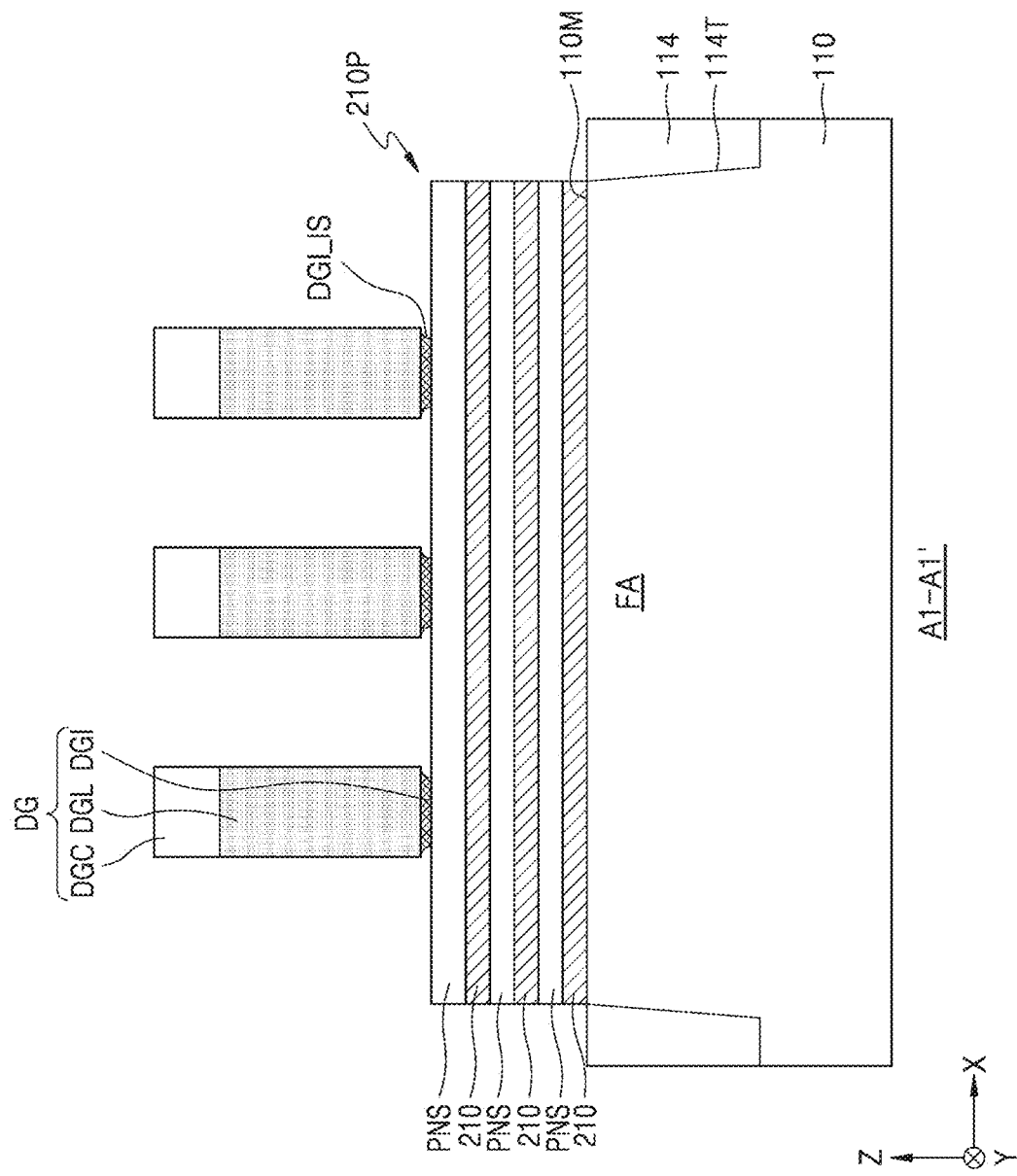

Referring to FIG. 9, by performing an additional etching process of removing the protrusion sidewall DGI_OS (see FIG. 8A) of the dummy gate dielectric layer DGI, the dummy gate dielectric layer DGI may be formed to include a recess sidewall DGI_IS.

The recess sidewall DGI_IS may include a portion which is recessed more inward than the sidewall of the dummy gate line DGL. In some example embodiments, the additional etching process of removing the protrusion sidewall DGI_OS (see FIG. 8A) of the dummy gate dielectric layer DGI may include and/or be performed with a wet etching process, which may be an isotropic etching process. Therefore, the recess sidewall DGI_IS may have a round shape. The wet etching process may be controlled to restrict etching performed at a portion other than the dummy gate dielectric layer DGI.

Figure 10:
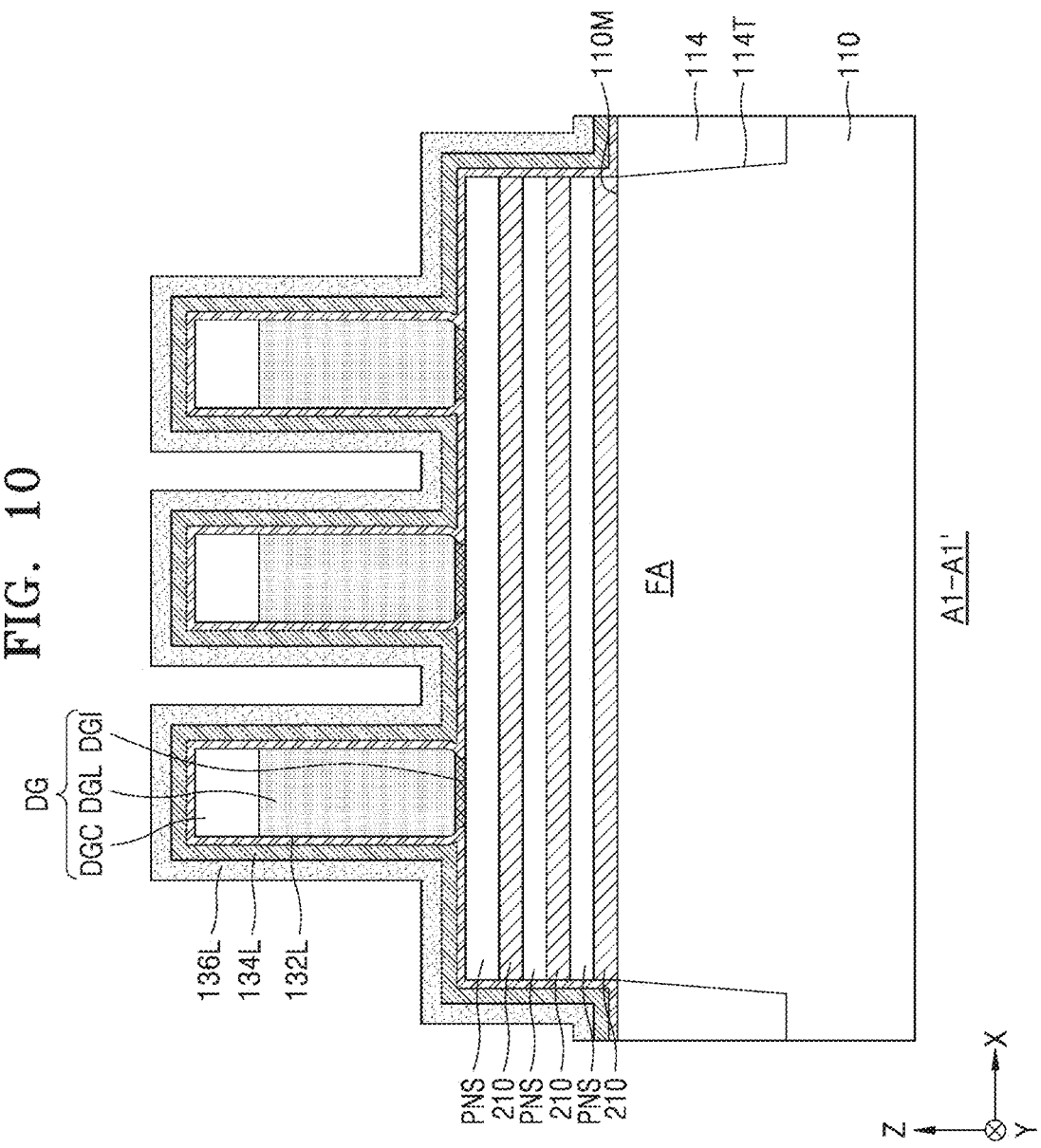

Referring to FIG. 10, a first spacer layer 132L, a second spacer layer 134L, and a cover spacer layer 136L may be sequentially formed on the dummy gate structure DG. The first spacer layer 132L, the second spacer layer 134L, and the cover spacer layer 136L may be formed with a chemical vapor deposition (CVD) process, such as a plasma enhanced chemical vapor deposition (PECVD) process.

Each of the first spacer layer 132L and the second spacer layer 134L may include silicon nitride or silicon oxynitride, and the cover spacer layer 136L may include silicon oxide. However, inventive concepts are not limited thereto.

The first spacer layer 132L may be conformally formed on the recess sidewall DGI_IS (see FIG. 9) of the dummy gate dielectric layer DGI. Therefore, a portion of the first spacer layer 132L contacting the recess sidewall DGI_IS (see FIG. 9) of the dummy gate dielectric layer DGI may correspond to the round protrusion portion 132P (see FIG. 2C).

Figure 11:
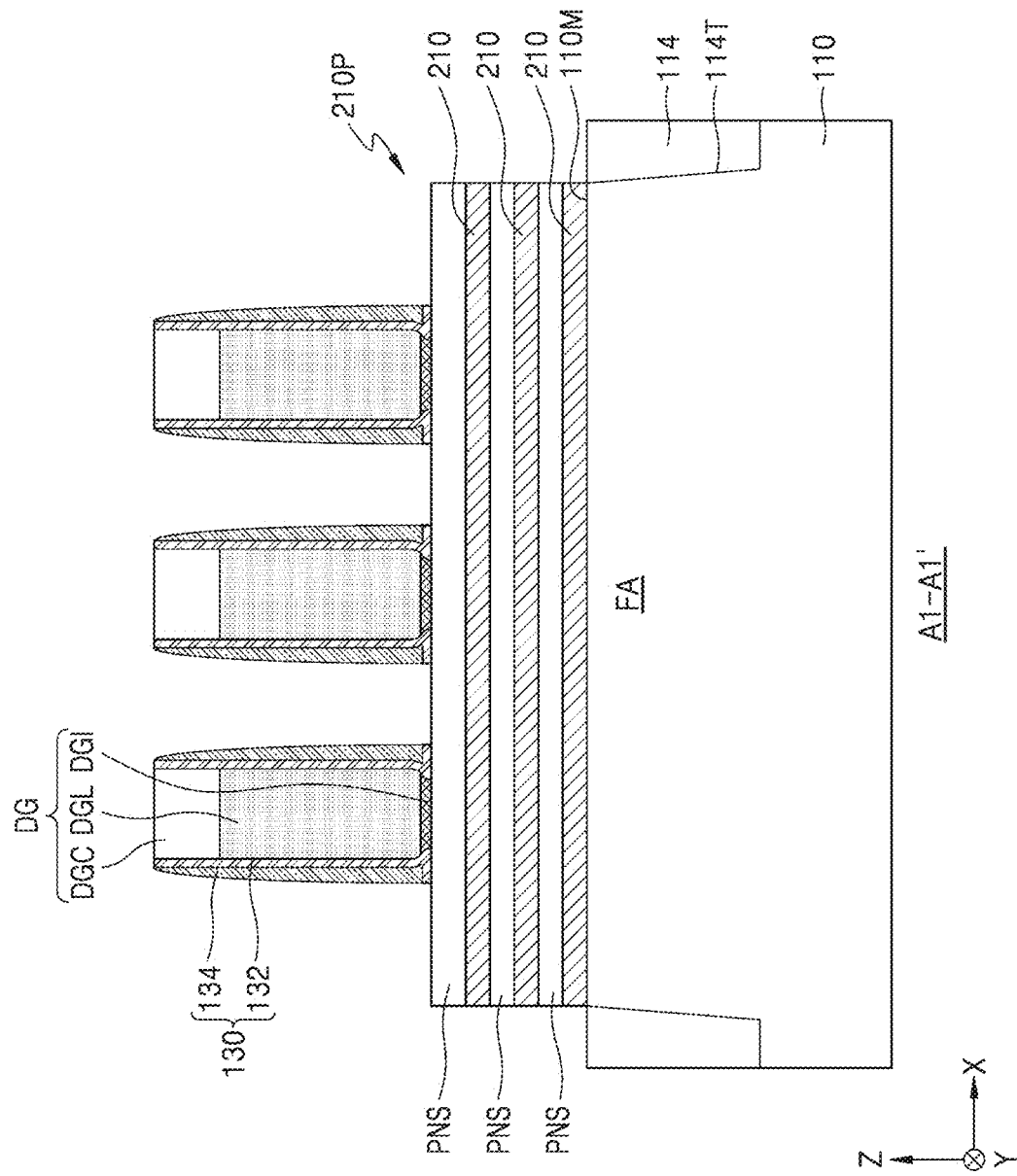

Referring to FIG. 11, the spacer structure 130 may be formed at both sides of the dummy gate structure DG by performing an isotropic etching process on the first spacer layer 132L (see FIG. 10), the second spacer layer 134L (see FIG. 10), and the cover spacer layer 136L (see FIG. 10).

In the isotropic etching process, the cover spacer layer 136L (see FIG. 10) disposed on an upper surface of the dummy gate structure DG and an upper surface of the sacrificial layer pattern 210P may be removed together. The spacer structure 130 may include a first spacer 132 and a second spacer 134, which are sequentially disposed on a sidewall of the dummy gate structure DG, and a bottom surface of the second spacer 134 may be surrounded by the first spacer 132.

In the drawing, it is illustrated that the cover spacer layer 136L (see FIG. 10) is completely removed and a sidewall of the second spacer 134 is not covered, but inventive concepts is not limited thereto. For example, a portion of the cover spacer layer 136L (see FIG. 10) may remain on at least a portion of the sidewall of the second spacer 134. In this case, an additional etching process of removing the cover spacer layer 136L (see FIG. 10) may be further performed. Alternatively, the additional etching process of removing the cover spacer layer 136L (see FIG. 10) may not be performed, and a remaining portion of the cover spacer layer 136L (see FIG. 10) may be removed together in a subsequent process of forming a recess region RS1.

Referring to FIGS. 12A and 12B, the recess region RS1 may be formed at both sides of the dummy gate structure DG by etching a portion of the substrate 110 and the sacrificial layer pattern 210P (see FIG. 11) at both sides of the spacer structure 130 and the dummy gate structure DG.

As the recess region RS1 is formed, the sacrificial layer pattern 210P (see FIG. 11) may be separated into a plurality of semiconductor patterns NS. For example, the plurality of semiconductor patterns NS may include first to third semiconductor patterns NS1 to NS3 that are apart from one another by the sacrificial layer 210.

In some example embodiments, in a process of forming the recess region RS1, a portion of an uppermost semiconductor pattern NS (e.g. the third semiconductor pattern NS3) overlapping the spacer structure 130 may not be removed, but a portion of the other semiconductor pattern NS (e.g. the second semiconductor pattern NS2 and/or the first semiconductor pattern NS1) overlapping the spacer structure 130 may be removed. A center width of the recess region RS may be greater than a top width of the recess region RS1, and the plurality of semiconductor patterns NS and a plurality of sacrificial layers 210 may each include an inclined surface provided at a portion overlapping the spacer structure 130.

An upper surface of the second spacer layer 134L (see FIG. 10) may be covered by the cover spacer layer 136L (see FIG. 10) in a process of forming the spacer structure 130, and thus, a width d11 of the spacer structure 130 remaining in an anisotropic etching process in a first direction (an X direction) may be relatively large. (See FIG. 12B). For example, when a width d11 of the second spacer 134 in the first direction (the X direction) is relatively large, a portion of the sacrificial layer 210 adjacent to the spacer structure 130 may be less exposed to an etching atmosphere in a process of forming the recess region RS1, and thus, an inclined surface of the sacrificial layer 210 may be formed. Also, since the first spacer 132 may include the round protrusion portion 132P, a separation distance between the recess region RS1 and the dummy gate structure DG may relatively more increase.

Referring to FIGS. 13A and 13B, a source/drain region 140 may be formed by sequentially forming a first semiconductor layer 142 and a second semiconductor layer 144 in the recess region RS1.

The first and second semiconductor layers 142 and 144 may be formed by epitaxial-growing semiconductor materials from a surface of the substrate 110, the sacrificial layer 210, and the plurality of semiconductor patterns NS exposed at an inner wall of the recess region RS1. The first and second semiconductor layers 142 and 144 may include at least one of an epitaxial-grown Si layer, an epitaxial-grown SiC layer, an epitaxial-grown SiGe layer, or an epitaxial-grown SiP layer. Other dopants, such as boron, may be incorporated into the first and second semiconductor layers 142 and 144 during the epitaxial process.

As illustrated in FIG. 13B, a first width WE of the first semiconductor layer 142 in the second direction (the Y direction) may be greater than or equal to a second width WC of a center portion of the first semiconductor layer 142 in the first direction (the X direction). This may be obtained as a result of epitaxial growth, but inventive concepts is not limited thereto.

Subsequently, a gate insulation liner 152 and an inter-gate insulation layer 154 may be sequentially formed on a sidewall of the spacer structure 130 and the source/drain region 140. The gate insulation liner 152 and the inter-gate insulation layer 154 may be formed with a CVD process such as a PECVD process; however, example embodiments are not limited thereto. By planarizing an upper portion of each of the dummy gate structure DG, e.g. with a CMP process and/or an etch-back process, the gate insulation liner 152, and the inter-gate insulation layer 154, the dummy gate capping layer DGC (see FIG. 12A) of the dummy gate structure DG may be removed and an upper surface of the dummy gate line DGL may be exposed.

Figure 14A:
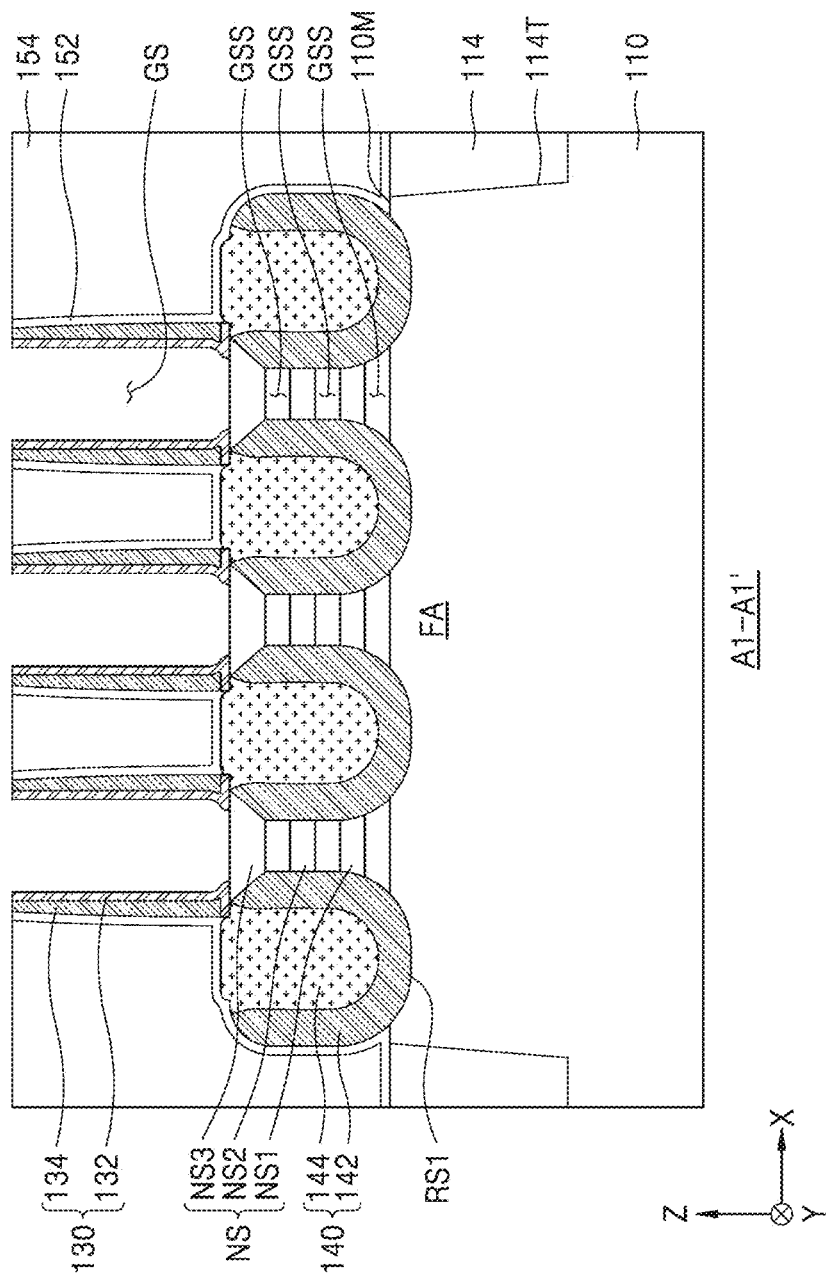
Figure 14B:
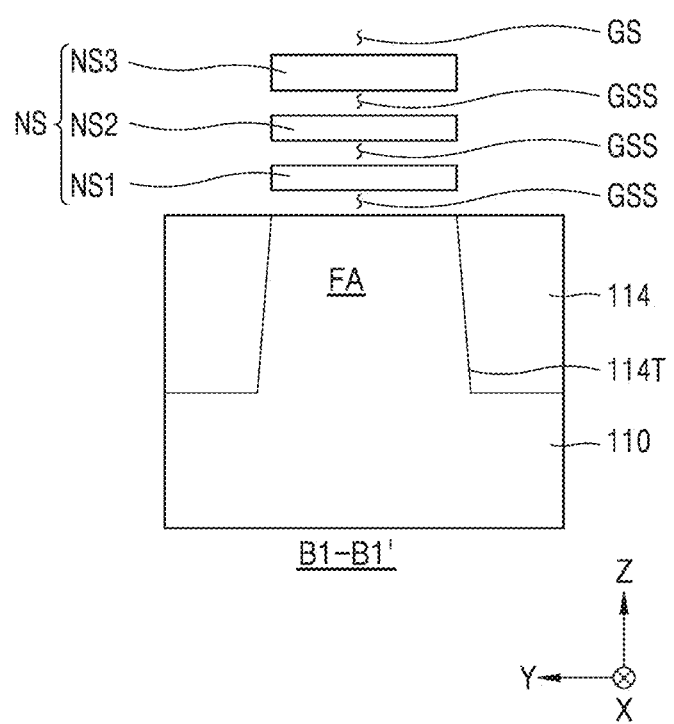

Referring to FIGS. 14A and 14B, a main gate electrode space GS may be formed by removing the dummy gate line DGL (see FIG. 13A) and the dummy gate dielectric layer DGI (see FIG. 13A) each exposed through the inter-gate insulation layer 154.

Subsequently, a portion of an upper surface of each of the plurality of semiconductor patterns NS and a portion of an upper surface of the fin-type active region FA may be exposed by removing, through the main gate electrode space GS, a plurality of sacrificial layers 210 (see FIG. 13A) remaining in the fin-type active region FA. Therefore, a sub-gate electrode space GSS may be formed between adjacent semiconductor patterns NS of the plurality of semiconductor patterns NS and between a lowermost semiconductor pattern NS and the fin-type active region FA. A process of removing the plurality of sacrificial layers 210 may be or include a wet etching process using an etch selectivity difference between the sacrificial layer 210 (see FIG. 13A) and each of the plurality of semiconductor patterns NS.

Since the width d11 of the spacer structure 130 in the first direction (the X direction) is relatively large and the first spacer 132 includes the round protrusion portion 132P, in a process of removing the dummy gate line DGL the upper surface of the source/drain region 140 may not be exposed at the main gate electrode space GS (see FIG. 13A).

For example, when a separation distance between the source/drain region 140 and the dummy gate line DGL (see FIG. 13A) is relatively small, an edge portion of the source/drain region 140 may also be exposed to the etching atmosphere in the process of removing the dummy gate line DGL (see FIG. 13A), and an error where the source/drain region 140 is removed or partially removed and/or a gate electrode material is filled into a removed portion may occur.

However, since the width d11 of the spacer structure 130 in the first direction (the X direction) is relatively large and the first spacer 132 includes the round protrusion portion 132P, the occurrence of a defect may be considerably prevented in the process of removing the dummy gate line DGL (see FIG. 13A).

Figure 15A:
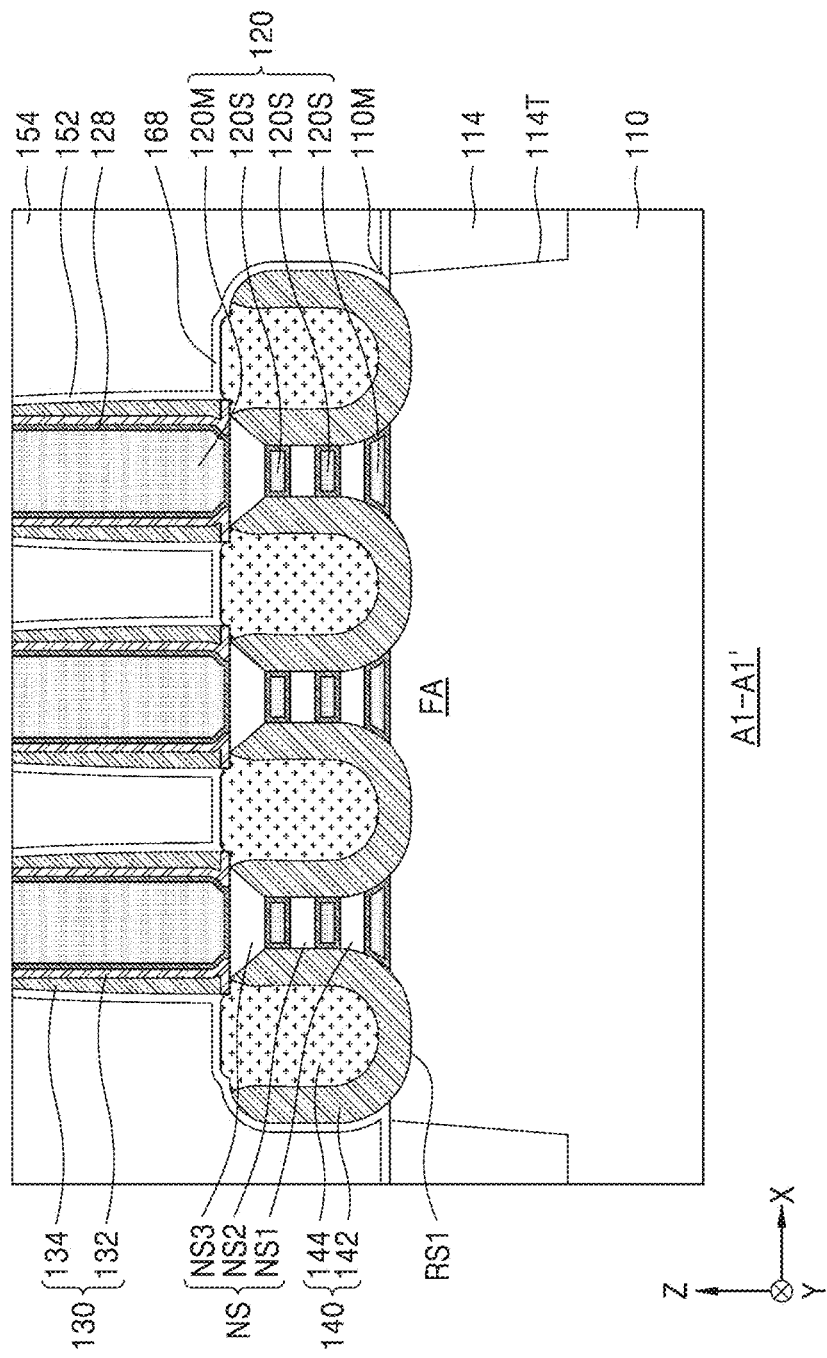
Figure 15B:
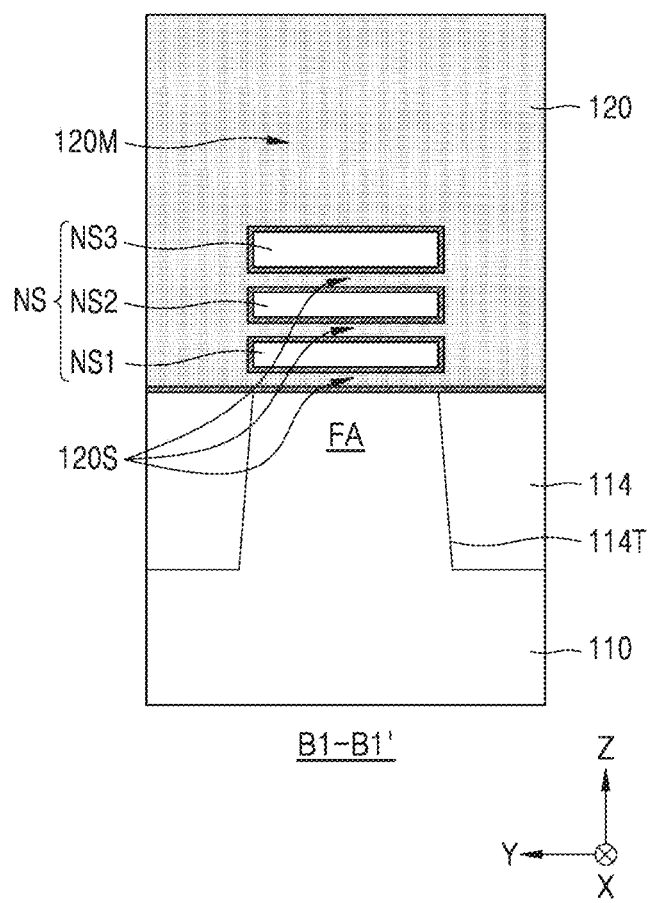

Referring to FIGS. 15A and 15B, a gate dielectric layer 128 may be formed on each of surfaces exposed at the main gate electrode space GS (see FIG. 14A) and the sub-gate electrode space GSS (see FIG. 14A).

Subsequently, a gate electrode 120 filled into the main gate electrode space GS (see FIG. 14A) and the sub-gate electrode space GSS (see FIG. 14A) may be formed on the gate dielectric layer 128. For example, a work function control layer (not shown) may be conformally formed on an inner wall of each of the main gate electrode space GS (see FIG. 14A) and the sub-gate electrode space GSS (see FIG. 14A), and then, a buried conductive layer (not shown) may be formed on the work function control layer to fill the main gate electrode space GS (see FIG. 14A) and the sub-gate electrode space GSS (see FIG. 14A).

Subsequently, the gate electrode 120 may be formed by planarizing an upper portion of the buried conductive layer so that an upper surface of the inter-gate insulation layer 154 is exposed. The planarizing can include at least one of a CMP process or an etch-back process.

Referring again to FIG. 2A, an upper insulation layer 162 may be formed, a contact hole 166H passing through the upper insulation layer 162 may be formed subsequently, and a contact plug 166 may be formed by filling the contact hole 166H with a conductive material subsequently. By performing such a process, the integrated circuit device 10 according to an embodiment may be manufactured.

Figure 16:
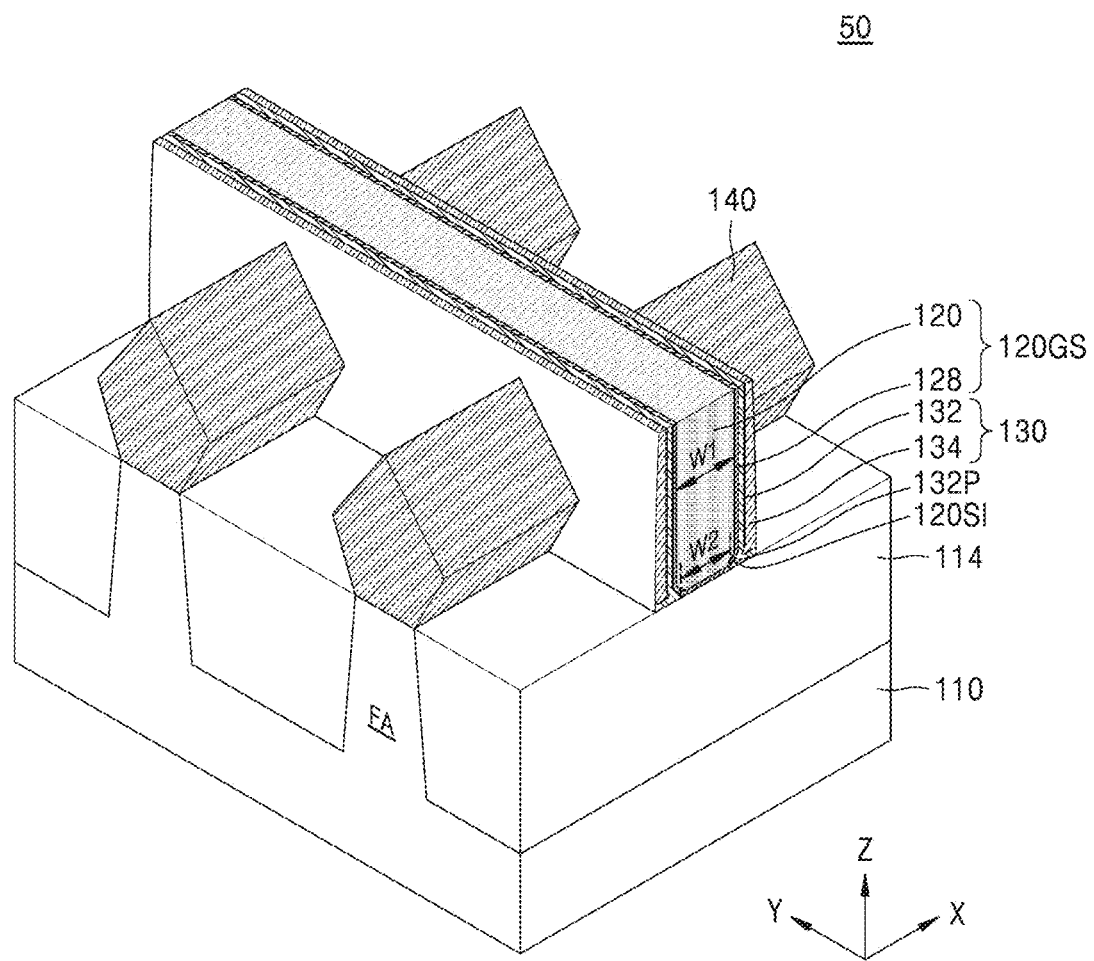
FIG. 16 is a perspective view illustrating an integrated circuit device according to an embodiment.

FIG. 16 is a perspective view illustrating an integrated circuit device 50 according to some example embodiments.

Referring to FIG. 16, the integrated circuit device 50 may include a source/drain region 140 and a gate structure 120GS, which are formed as heterogeneous and/or homogenous epitaxial growth layers on an upper surface of a fin-type active region FA provided in a substrate 110.

The integrated circuit device 50 may include a field-effect transistor having a fin structure. Unlike a field-effect transistor having a two-dimensional, e.g. planar, structure, the field-effect transistor having the fin structure may have characteristic where the source/drain region 140 is not limited by an isolation layer 114.

A gate structure 120GS may include a gate electrode 120 and a gate dielectric layer 128. A center portion of the gate electrode 120 may have a first width W1 in a first direction (an X direction), and a bottom portion of the gate electrode 120 may have a second width W2 less than the first width W1 in the first direction (the X direction).

A round inclined surface 120S1 may be formed at the bottom portion of the gate electrode 120, and the first spacer 132 of the spacer structure 130 may fill a space defined by the round inclined surface 120S1 and an upper surface of the isolation layer 114. For example, the first spacer 132 may include a round protrusion portion 132P provided at a bottom portion thereof, and the round protrusion portion 132P may fill a space defined by the round inclined surface 120S1 and the upper surface of the isolation layer 114.

The gate dielectric layer 128 may be disposed between the round inclined surface 120S1 and the round protrusion portion 132P. The round inclined surface 120S1 of the gate electrode 120 may vertically overlap a portion (e.g., the round protrusion portion 132P of the first spacer 132) of the spacer structure 130.

While inventive concepts have been particularly shown and described with reference to embodiments thereof, it will be understood that various changes in form and details may be made therein without departing from the spirit and scope of the following claims.

What is claimed is:

1. A method of manufacturing an integrated circuit device, the method comprising:
   forming a fin-type active region that protrudes from a substrate and extends in a first direction;
   forming a plurality of semiconductor patterns that are apart from an upper surface of the fin-type active region;
   forming a gate electrode that surrounds the plurality of semiconductor patterns and extends in a second direction perpendicular to the first direction, the gate electrode comprising a main gate electrode on an uppermost semiconductor pattern of the plurality of semiconductor patterns and a sub-gate electrode between two of the plurality of semiconductor patterns;

forming a spacer structure on both sidewalls of the main gate electrode; and forming source/drain regions that are connected to the plurality of semiconductor patterns at both sides of the gate electrode and contact a bottom surface of the spacer structure, wherein a center portion of the main gate electrode has a first width in the first direction, a bottom portion of the main gate electrode has a second width in the first direction that is less than the first width, a space between center portions of adjacent ones of the source/drain regions has a third width in the first direction that is less than the second width, and the sub-gate electrode has a fourth width in the first direction that is less than the first width.

2. The method of claim 1, wherein, in the forming of the gate electrode, the main gate electrode is formed to have a rounded inclined surface inclined from the bottom portion of the main gate electrode to the sidewall of the main gate electrode, the round inclined surface being inclined relative to a third direction perpendicular to each of the first and second directions.

3. The method of claim 2, wherein, in the forming of the spacer structure, the rounded inclined surface of the main gate electrode vertically overlaps a portion of the spacer structure.

4. The method of claim 3, wherein, in the forming of the spacer structure, a first spacer and a second spacer are sequentially formed on the sidewall of the main gate electrode, and the first spacer is formed to fill a space defined by the rounded inclined surface of the main gate electrode and an upper surface of the uppermost semiconductor pattern.

5. The method of claim 1, wherein, in the forming of the source/drain regions, the source/drain regions are formed to comprise:

a first semiconductor layer on an inner wall of a recess region formed in the fin-type active region at both sides of the gate electrode; and a second semiconductor layer on the first semiconductor layer, the second semiconductor layer filling the recess region.

6. The method of claim 5, wherein, in the forming of the source/drain regions, each of the first semiconductor layer and the second semiconductor layer is formed to comprise epitaxial silicon germanium (SiGe), and a concentration of germanium (Ge) of the first semiconductor layer is less than a concentration of Ge of the second semiconductor layer.

7. The method of claim 6, wherein, in the forming of the source/drain regions, the first semiconductor layer is formed to further comprise impurities which are not included in the second semiconductor layer.

8. The method of claim 5, wherein, in the forming of the source/drain regions, the first semiconductor layer is formed to comprise an inclined surface in a third direction perpendicular to each of the first and second directions, the inclined surface being inclined from an upper surface of the first semiconductor layer to a center portion of the first semiconductor layer.

9. The method of claim 8, wherein, in the forming of the source/drain regions, at least a portion of the inclined surface of the first semiconductor layer vertically overlaps the sidewall of the main gate electrode, and another portion of the inclined surface of the first semiconductor layer vertically overlaps the bottom portion of the main gate electrode.

10. The method of claim 5, wherein, in the forming of the source/drain regions, in a plan view, a first width in the second direction of the first semiconductor layer is greater than or equal to a second width in the first direction of a center portion of the first semiconductor layer.

11. A method of manufacturing an integrated circuit device, the method comprising:

forming a fin-type active region that protrudes from a substrate and extends in a first direction;

forming a plurality of semiconductor patterns that are apart from an upper surface of the fin-type active region;

forming a gate electrode that surrounds the plurality of semiconductor patterns and extends in a second direction perpendicular to the first direction, the gate electrode comprising a main gate electrode on an uppermost semiconductor pattern of the plurality of semiconductor patterns and a sub-gate electrode between two of the plurality of semiconductor patterns;

forming a spacer structure on both sidewalls of the main gate electrode; and forming source/drain regions that are connected to the plurality of semiconductor patterns at both sides of the gate electrode and contact a bottom surface of the spacer structure, wherein the main gate electrode comprises a rounded inclined surface inclined from a bottom portion of the main gate electrode to the sidewall of the main gate electrode, the rounded inclined surface being inclined relative to a third direction perpendicular to an upper surface of the substrate.

12. The method of claim 11, wherein, in the forming of the gate electrode, a center portion of the main gate electrode has a first width in the first direction, and the bottom portion of the main gate electrode has a second width in the first direction that is less than the first width, and in the forming of the source/drain regions, a space between center portions of adjacent ones of the source/drain regions has a third width in the first direction that is less than the second width.

13. The method of claim 12, wherein, in the forming of the gate electrode, an upper portion of the uppermost semiconductor pattern has a top width in the first direction, and a lower portion of the uppermost semiconductor pattern has a bottom width in the first direction, and the second width is less than the top width and is greater than the bottom width.

14. The method of claim 11, wherein, in the forming of the spacer structure, a first spacer and a second spacer are sequentially formed on the sidewall of the main gate electrode, and the first spacer is formed to be conformal along the sidewalls of the main gate electrode, the rounded inclined surface of the main gate electrode, and an upper surface of the uppermost semiconductor pattern.

15. The method of claim 11, wherein, in the forming of the source/drain regions, the source/drain regions are formed to comprise:

a first semiconductor layer on an inner wall of a recess region formed in the fin-type active region at both sides of the gate electrode; and a second semiconductor layer on the first semiconductor layer, the second semiconductor layer filling the recess region.

16. A method of manufacturing an integrated circuit device, the method comprising:
- forming a fin-type active region that protrudes from a substrate and extends in a first direction;
- forming a plurality of semiconductor patterns that are apart from an upper surface of the fin-type active region;
- forming a gate electrode that surrounds the plurality of semiconductor patterns and extends in a second direction perpendicular to the first direction, the gate electrode comprising a main gate electrode on an uppermost semiconductor pattern of the plurality of semiconductor patterns and a sub-gate electrode between two of the plurality of semiconductor patterns;
- forming a gate dielectric layer between the plurality of semiconductor patterns and the gate electrode;
- forming a spacer structure on both sidewalls of the main gate electrode;

forming a pair of source/drain regions that are connected to the plurality of semiconductor patterns at both sides of the gate electrode and contact a bottom surface of the spacer structure; and

- forming a contact plug that is electrically connected to the pair of source/drain regions,
- wherein a center portion of the main gate electrode has a first width in the first direction, a bottom portion of the main gate electrode has a second width in the first direction that is less than the first width,
- a space between center portions of the pair of source/drain regions has a third width in the first direction that is less than the second width, and
- the main gate electrode comprises a rounded inclined surface inclined from the bottom portion of the main gate electrode to the sidewall of the main gate electrode in a third direction perpendicular to an upper surface of the substrate.

17. The method of claim 16, wherein, in the forming of the pair of source/drain regions, the pair of source/drain regions are formed to comprise:
- a first semiconductor layer on an inner wall of a recess region formed in the fin-type active region at both sides of the gate electrode; and
- a second semiconductor layer on the first semiconductor layer, the second semiconductor layer filling the recess region.

18. The method of claim 17, wherein, in the forming of the pair of source/drain regions, each of the first semiconductor layer and the second semiconductor layer is formed to comprise epitaxial silicon germanium (SiGe),
- a concentration of germanium (Ge) of the first semiconductor layer is less than a concentration of Ge of the second semiconductor layer, and
- the first semiconductor layer is formed to further comprise impurities which are not included in the second semiconductor layer.

19. The method of claim 17, wherein, in the forming of the contact plug, the contact plug is formed to contact the second semiconductor layer.

20. The method of claim 17, wherein, in the forming of the pair of source/drain regions, in a plan view, a first width in the second direction of the first semiconductor layer is greater than or equal to a second width in the first direction of a center portion of the first semiconductor layer.

* * * * *